(12) United States Patent
Park et al.

(10) Patent No.: US 11,932,023 B2
(45) Date of Patent: Mar. 19, 2024

(54) RESERVOIR OF LIGHT EMITTING ELEMENTS, PRINTING APPARATUS INCLUDING THE SAME, AND MANUFACTURING METHOD OF DISPLAY DEVICE USING THE SAME

(71) Applicant: Samsung Display Co., Ltd., Yongin-si (KR)

(72) Inventors: Sung Ho Park, Yongin-si (KR); Jae Won Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 374 days.

(21) Appl. No.: 17/446,428

(22) Filed: Aug. 30, 2021

(65) Prior Publication Data

US 2022/0161566 A1 May 26, 2022

(30) Foreign Application Priority Data

Nov. 20, 2020 (KR) .................. 10-2020-0157076

(51) Int. Cl.
*B41J 2/175* (2006.01)
*H01L 25/16* (2023.01)
*H01L 33/00* (2010.01)
*H01L 33/24* (2010.01)
*H01L 33/26* (2010.01)

(52) U.S. Cl.
CPC ........ *B41J 2/17526* (2013.01); *H01L 25/167* (2013.01); *H01L 33/005* (2013.01); *H01L 33/24* (2013.01); *H01L 33/26* (2013.01)

(58) Field of Classification Search
CPC ....... B41J 2/175; B41J 2/17526; H01L 24/95; H01L 25/0753; H01L 25/167; H01L 33/005; H01L 33/24; H01L 33/26; H01L 33/62; H01L 2224/95101
See application file for complete search history.

(56) References Cited

U.S. PATENT DOCUMENTS 6,383,047 B1 * 5/2002 Minami .................. H01J 9/027
445/6
2022/0139871 A1 * 5/2022 Hong .................... C09D 11/033
438/34

FOREIGN PATENT DOCUMENTS

| JP | 2007-160783 A | | 6/2007 | |
| KR | 1997-0033006 A | | 7/1997 | |
| KR | 20180055021 | * | 5/2018 | ............. H01L 33/48 |

* cited by examiner

*Primary Examiner* — Matthew G Marini
(74) *Attorney, Agent, or Firm* — Lewis Roca Rothgerber Christie LLP

(57) ABSTRACT

A reservoir of a light emitting element includes a storage container accommodating a material in which at least one light emitting element is dispersed. A first electrode and a second electrode are spaced apart from each other in the inside of the storage container. A power supply is electrically coupled to each of the first electrode and the second electrode to apply a power source corresponding to each of the first electrode and the second electrode. Holes are formed in each of the first electrode and the second electrode.

18 Claims, 15 Drawing Sheets

RESERVOIR OF LIGHT EMITTING ELEMENTS, PRINTING APPARATUS INCLUDING THE SAME, AND MANUFACTURING METHOD OF DISPLAY DEVICE USING THE SAME

CROSS-REFERENCE TO RELATED APPLICATION

This application claims priority to and the benefit of Korean Patent Application No. 10-2020-0157076 filed in the Korean Intellectual Property Office on Nov. 20, 2020, the entire contents of which are hereby incorporated by reference.

BACKGROUND

1. Field

Embodiments of the present disclosure relate to a reservoir of light emitting elements, a printing apparatus including the same, and a manufacturing method of a display device using the same.

2. Description of the Related Art

As an interest in an information display largely increases and a demand for using a portable information medium increases, a demand and commercialization for a display device has been progressed in priority.

SUMMARY

Embodiments of the present disclosure have been made in an effort to provide a reservoir of light emitting elements that may prevent a supply failure of the light emitting elements (or reduce a likelihood or degree of such a supply failure), a printing apparatus including the same, and a manufacturing method of a display device using the same.

An embodiment of the present disclosure provides a reservoir of light emitting elements, the reservoir including: a storage container accommodating a material in which at least one light emitting element is dispersed; a first electrode and a second electrode spaced apart from each other in the storage container; and a power supply electrically coupled to each of the first electrode and the second electrode to apply a power source corresponding to each of the first electrode and the second electrode. Holes may be formed in each of the first electrode and the second electrode.

Each of the holes may have a diameter in a range from 1 μm to 20 μm.

The light emitting element may include a nano-scale to micro-scale light emitting diode, and a diameter of each of the holes may be larger than a length of the light emitting element.

Each of the first electrode and the second electrode may have a plate shape, and the first electrode and the second electrode may be alternately included along a first direction perpendicular (e.g., substantially perpendicular) to surfaces of the first electrode and the second electrode.

A gap between adjacent electrodes of the first electrode and the second electrode may be within a range of 10 μm to 1000 μm.

The first direction may be perpendicular (e.g., substantially perpendicular) to a direction of gravity.

The first direction may be a same as a direction of gravity.

Each of the first electrode and the second electrode may have a plate shape, and the first electrode and the second electrode may be spaced apart from each other along a direction parallel (e.g., substantially parallel) to surfaces of the first electrode and the second electrode.

The material may further include a fluid solvent, the at least one light emitting element may be dispersed in the solvent, the solvent may flow upwardly at a center of an area of each of the first electrode and the second electrode and may flow downwardly between the first electrode and the second electrode, by electroosmosis, and the material may be stirred in the storage container by the flowing of the solvent.

Voltages of different power sources respectively may be applied to the first electrode and the second electrode.

Each of the light emitting elements may include: a first semiconductor layer doped with a first conductive dopant; a second semiconductor layer doped with a second conductive dopant different from the first conductive dopant; and an active layer between the first semiconductor layer and the second semiconductor layer.

Another embodiment of the present disclosure provides a printing apparatus including: a storage unit accommodating a material in which at least one light emitting element is dispersed; and a print head unit that sprays the material supplied from the storage unit. The storage unit may include: a storage container accommodating the material in which the at least one light emitting element is dispersed; a first electrode and a second electrode spaced apart from each other in the storage container; and a power supply electrically coupled to each of the first electrode and the second electrode to apply a power source (e.g., an electric current) corresponding to each of the first electrode and the second electrode. Holes may be formed in each of the first electrode and the second electrode.

Each of the holes may have a diameter in a range from 1 μm to 20 μm.

The light emitting element may include a nano-scale to micro-scale light emitting diode, and a diameter of each of the holes may be larger than a length of the light emitting element.

Each of the first electrode and the second electrode may have a plate shape, and the first electrode and the second electrode may be alternately included along a first direction perpendicular (e.g., substantially perpendicular) to surfaces of the first electrode and the second electrode.

A gap between adjacent electrodes of the first electrode and the second electrode may be within a range of 10 μm to 1000 μm.

Another embodiment of the present disclosure provides a method of fabricating a display device that uses a printing apparatus including a storage unit accommodating a material in which at least one light emitting element is dispersed, and a print head unit that sprays the material supplied from the storage unit. The method of fabricating the display device includes: preparing a substrate including a first pixel electrode and a second pixel electrode spaced apart from each other; spraying the material onto the substrate through the print head unit; and aligning the light emitting element of the material between the first pixel electrode and the second pixel electrode.

The material may be a fluid solvent and an ink in which the light emitting element is dispersed in the solvent.

The method of the display device may further include applying a power source to first electrode and the second electrode spaced apart from each other in the storage container of the storage unit. An electric field may be formed between the first electrode and the second electrode, so that the material may be stirred by electroosmosis, and the light emitting element may be maintained in a floating state in the storage container.

Holes may be formed in each of the first electrode and the second electrode, and microbubbles generated inside the storage container in a process of stirring the material may be removed while passing through the holes.

According to embodiments of the present disclosure, by forming an electric field using electrodes facing each other in a storage container containing a material including a solvent in which a plurality of light emitting elements are dispersed, the material may be stirred by electroosmosis, and sedimentation of the light emitting elements may be prevented or reduced.

In addition, according to the embodiments of the present disclosure, by forming holes in the electrodes, microbubbles generated in a process of accommodating or stirring a material in a reservoir may be removed by the holes.

Accordingly, a supply failure of light emitting elements from a reservoir to a print head unit due to sedimentation of the light emitting elements or microbubbles may be prevented or reduced.

An effect according to the embodiment of the present disclosure is not limited by what is illustrated in the above, and additional various effects are included in the present specification.

Figure 3:
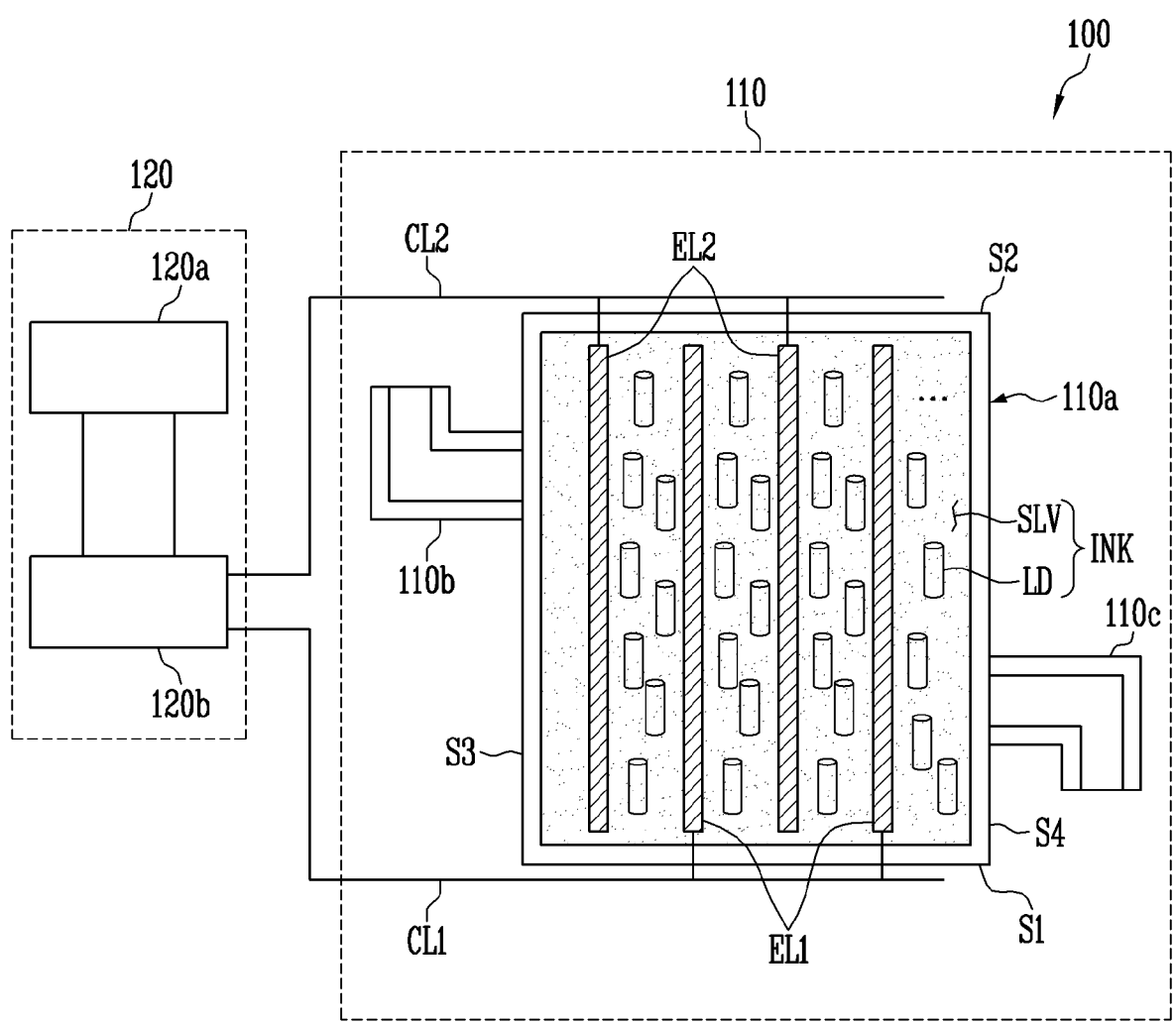
FIG. 3 is a schematic side cross-sectional view of a reservoir of light emitting elements according to an embodiment.

4A is a schematic perspective view of a storage part included in the reservoir of FIG. 3.

Figure 4A:
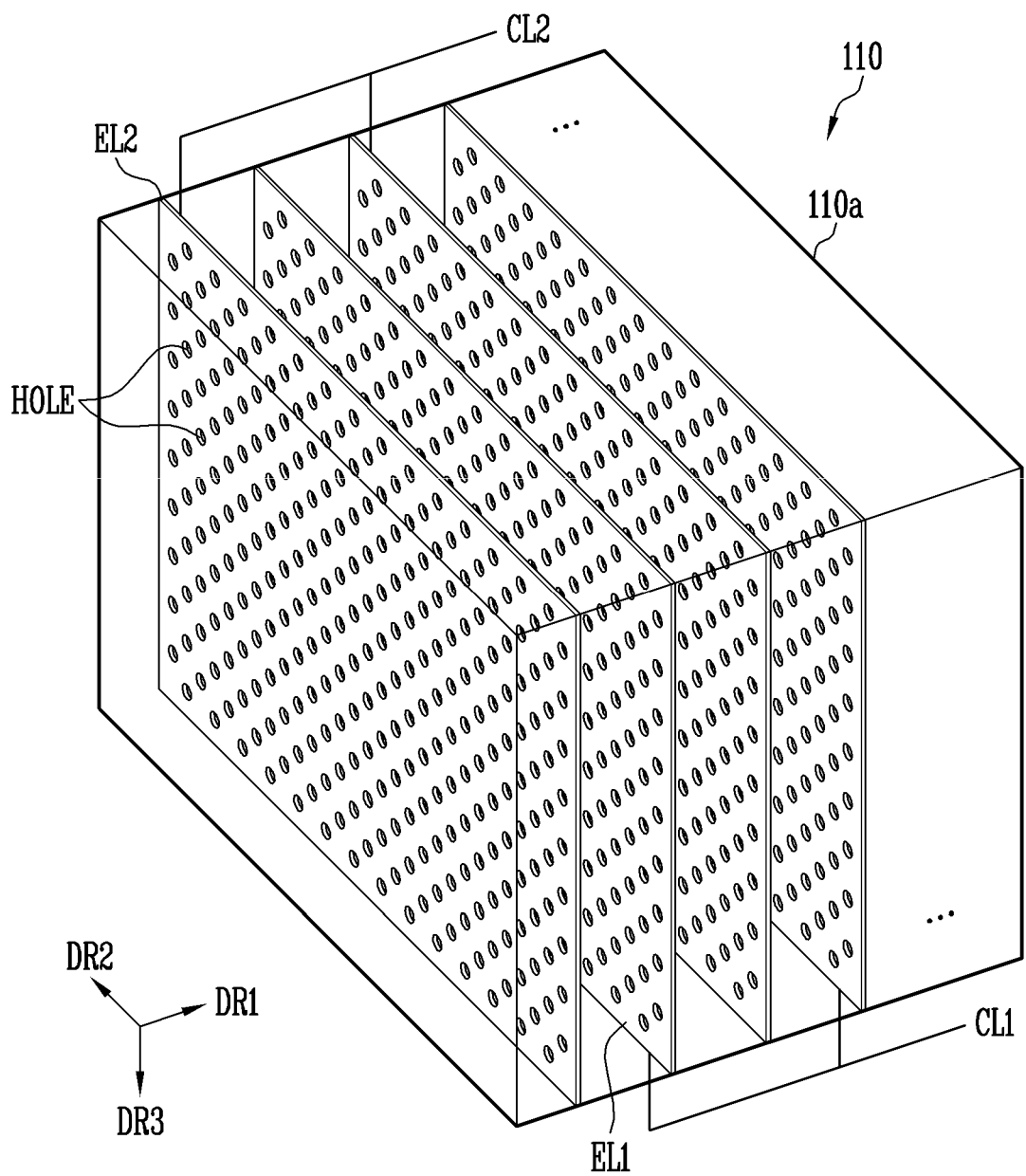
Figure 4B:
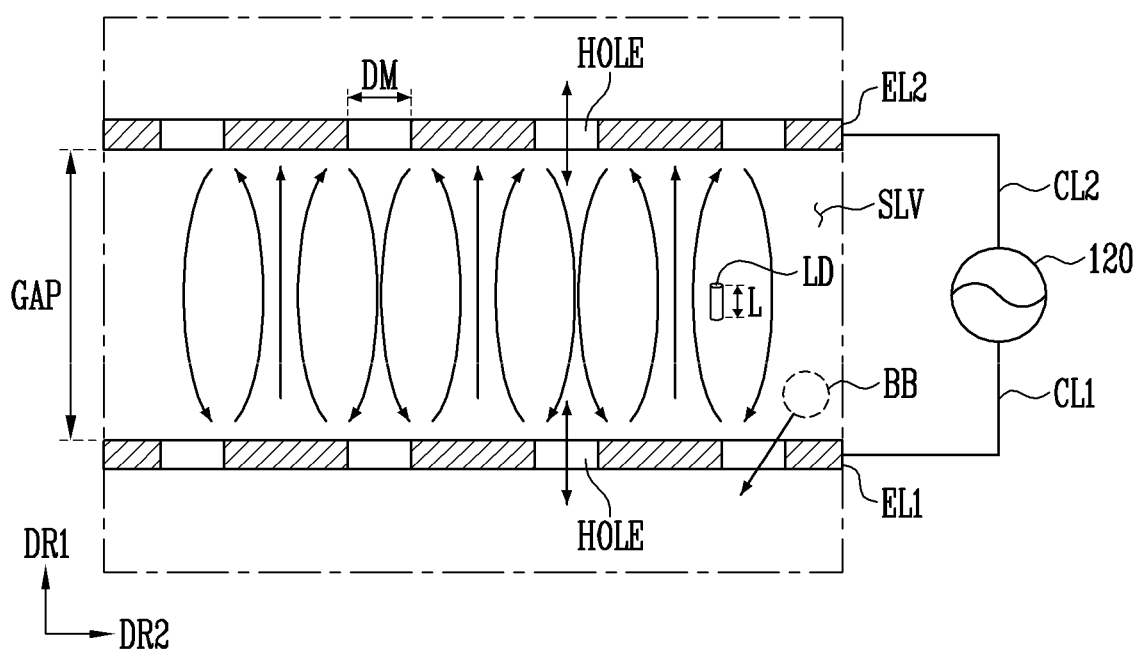

FIG. 4B is a side cross-sectional view of electrodes included in the storage part of FIG. 4A.

Figure 4C:
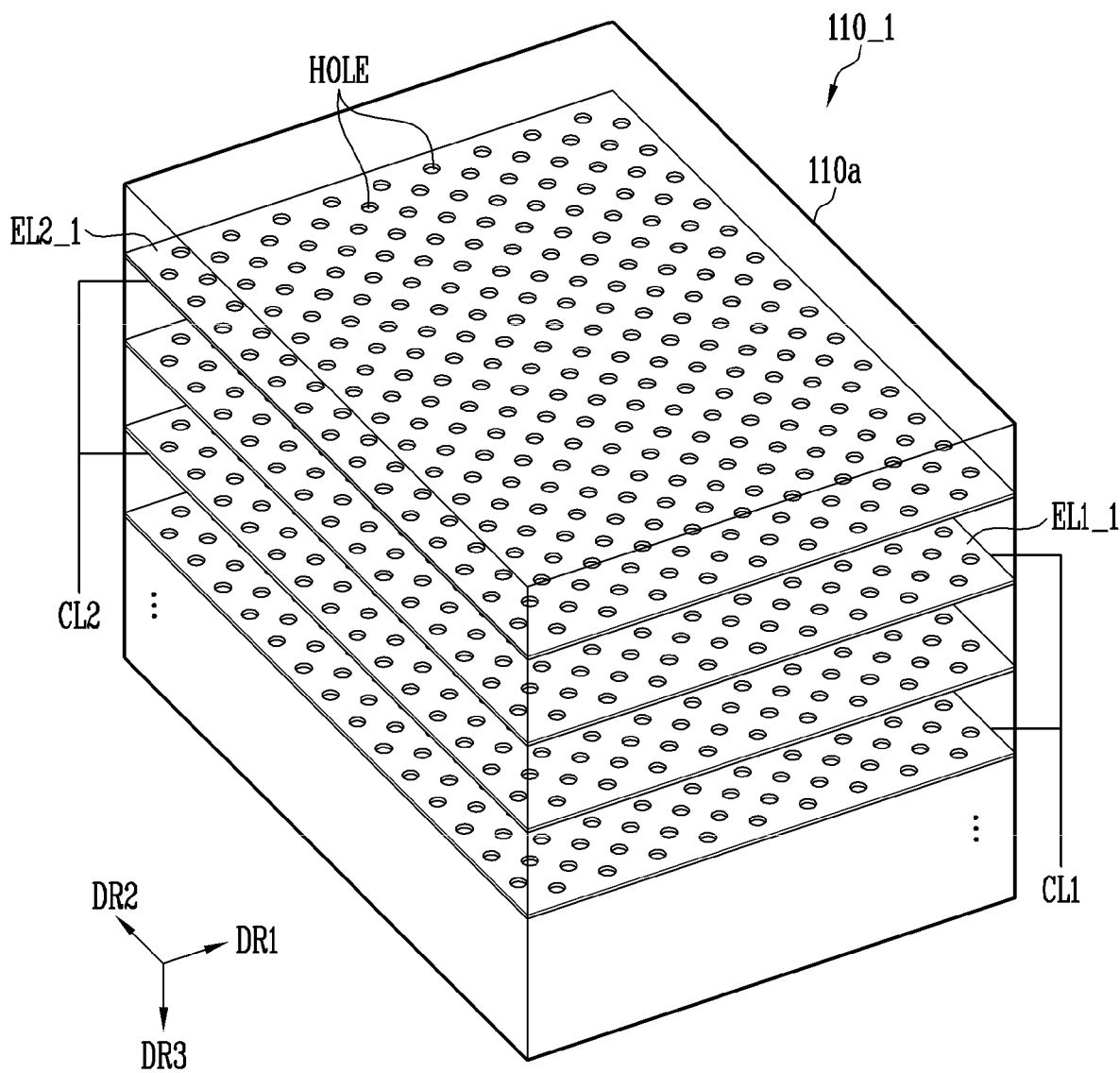

FIG. 4C is a schematic perspective view of another example of a storage part included in the reservoir of FIG. 3.

Figure 5:
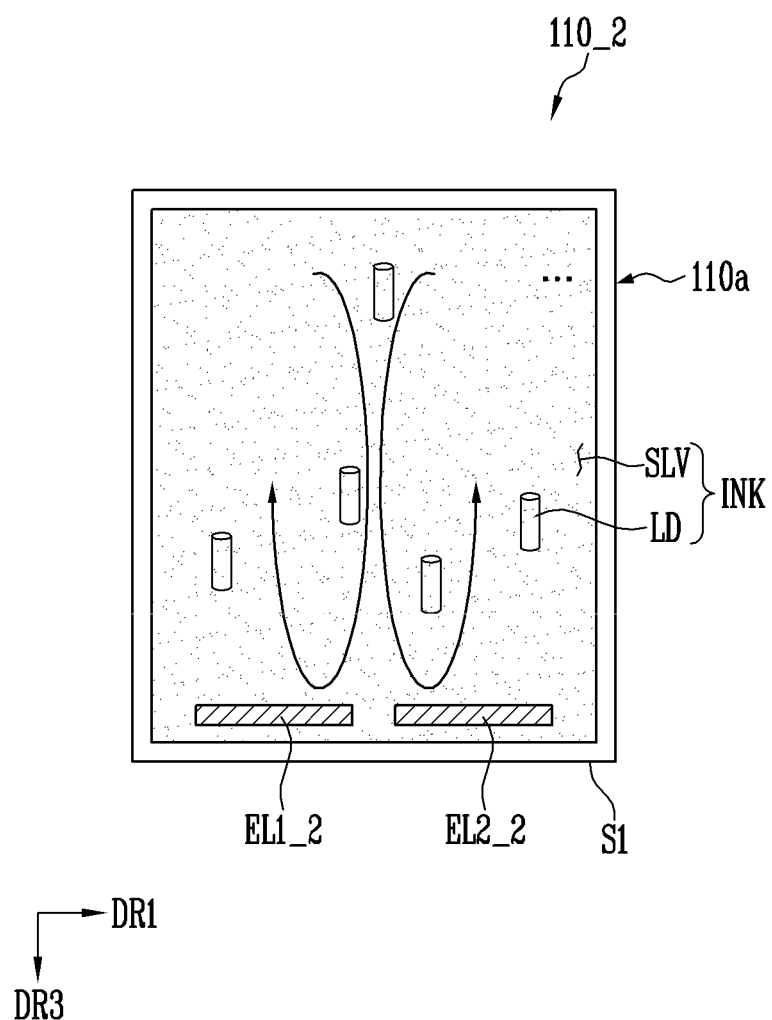

FIG. 5 is a schematic side cross-sectional view of another example of a storage part included in the reservoir of FIG. 3.

Figure 6:
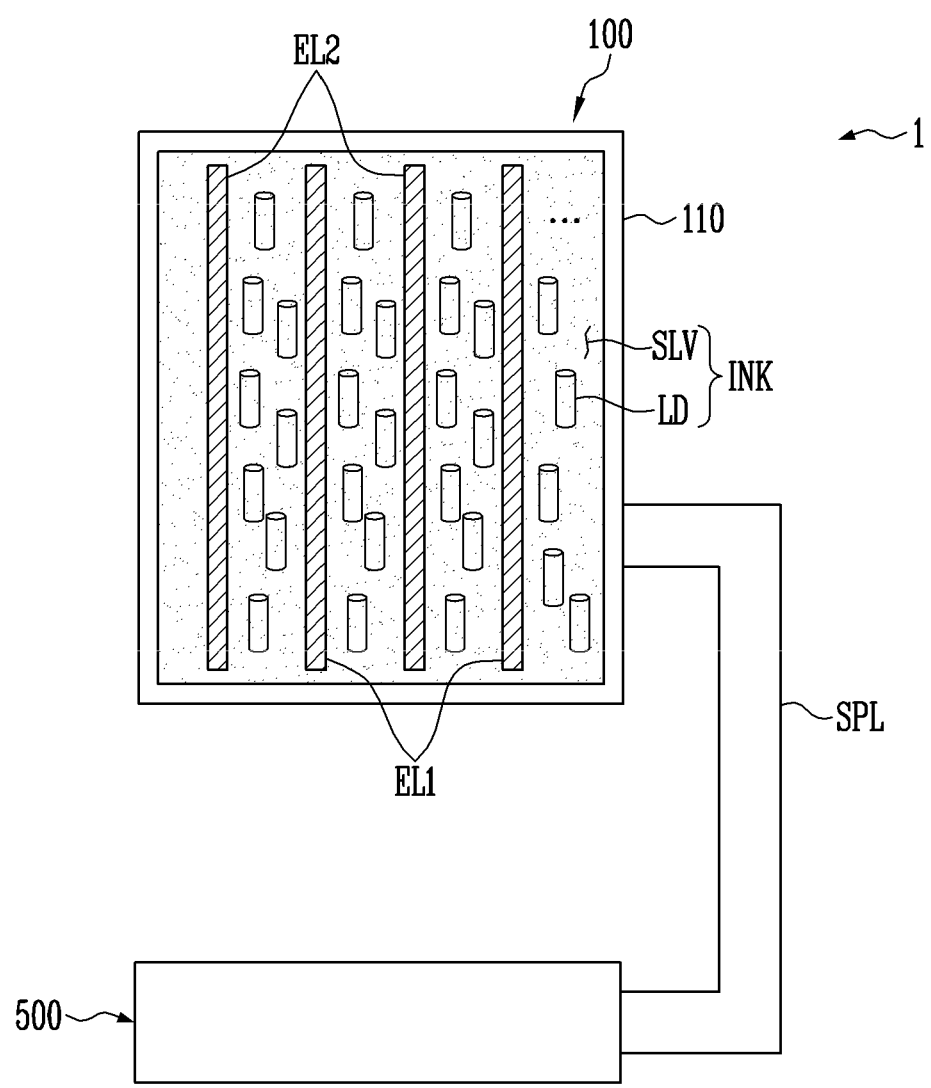

FIG. 6 is a schematic side cross-sectional view of a printing apparatus according to an embodiment.

Figure 7:
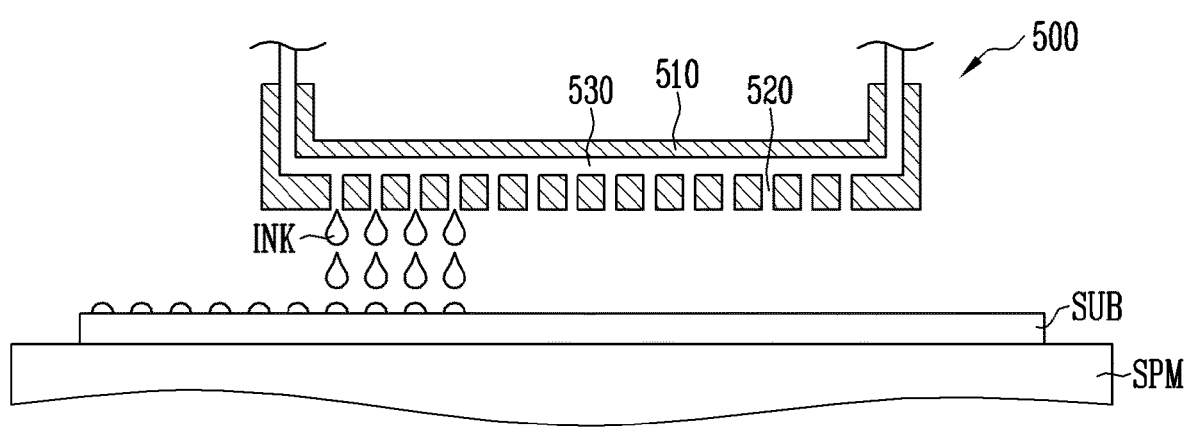

FIG. 7 is a schematic side cross-sectional view of a print head unit included in the printing apparatus of FIG. 6.

Figure 8:
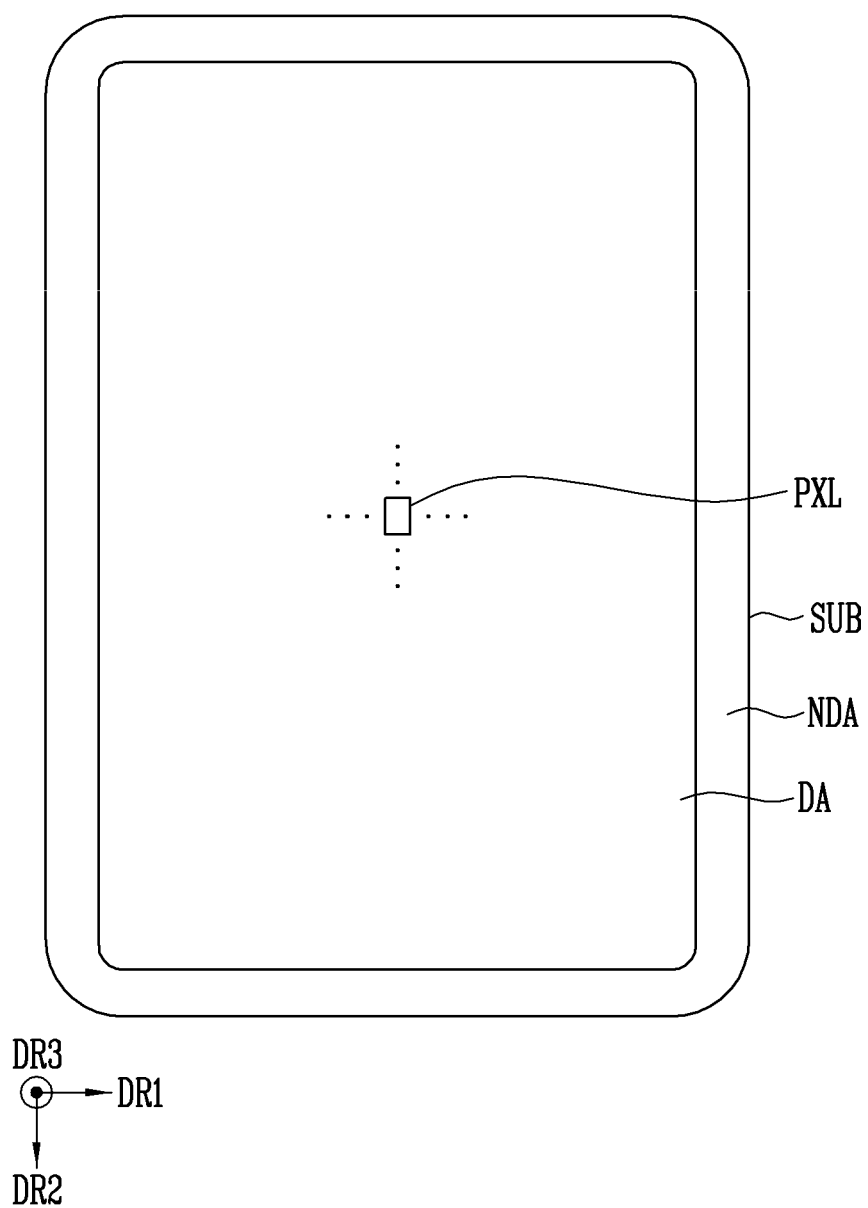

FIG. 8 is a schematic top plan view of a display device manufactured by a method according to an embodiment.

Figure 9:
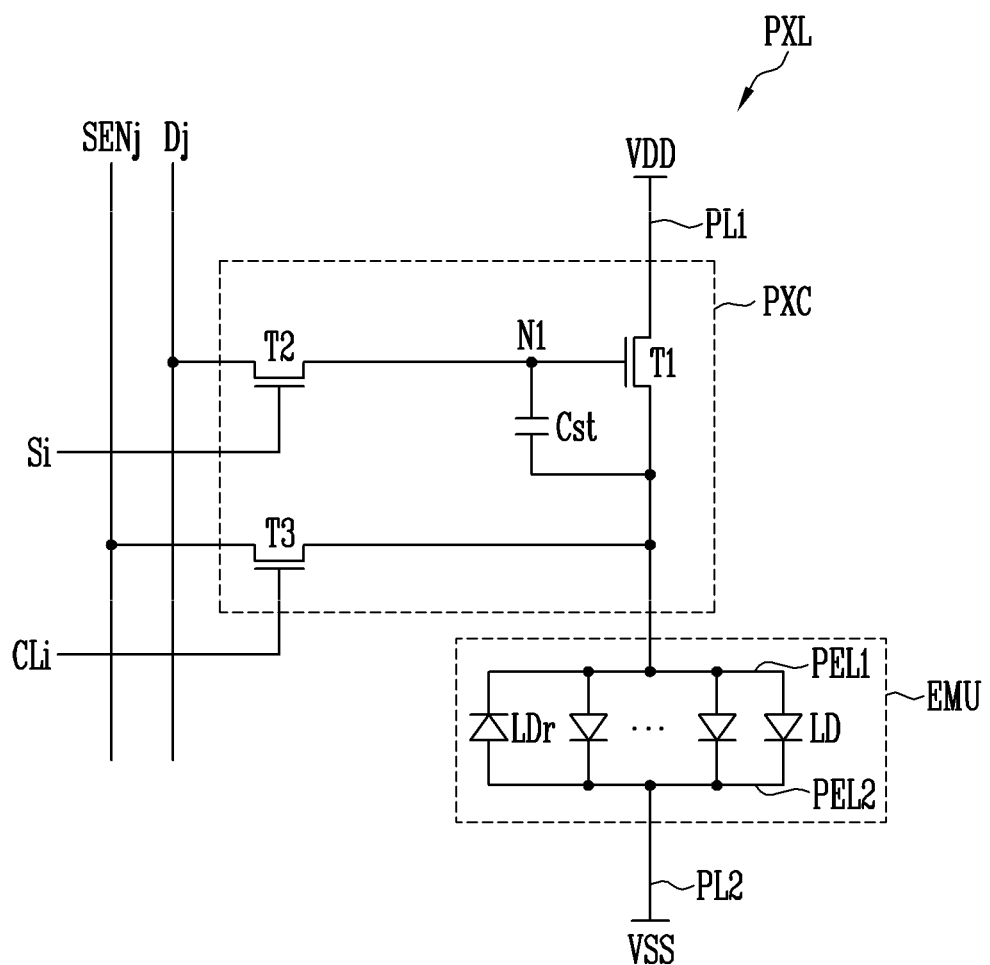

FIG. 9 is a circuit diagram of an electrical connection relationship between constituent elements in a pixel included in the display device of FIG. 8.

Figure 10:
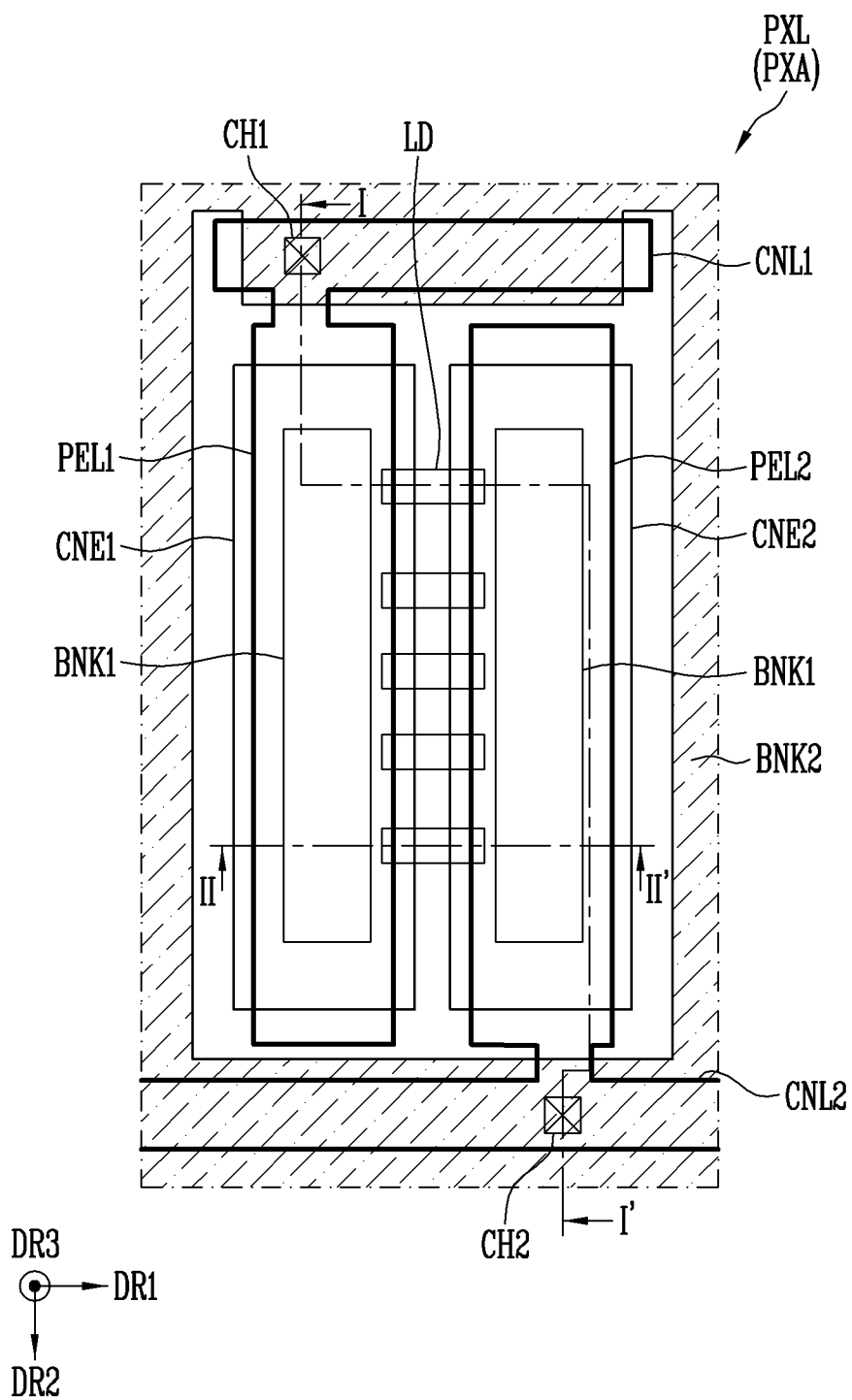

FIG. 10 is a schematic top plan view of a pixel included in the display device of FIG. 8.

Figure 11:
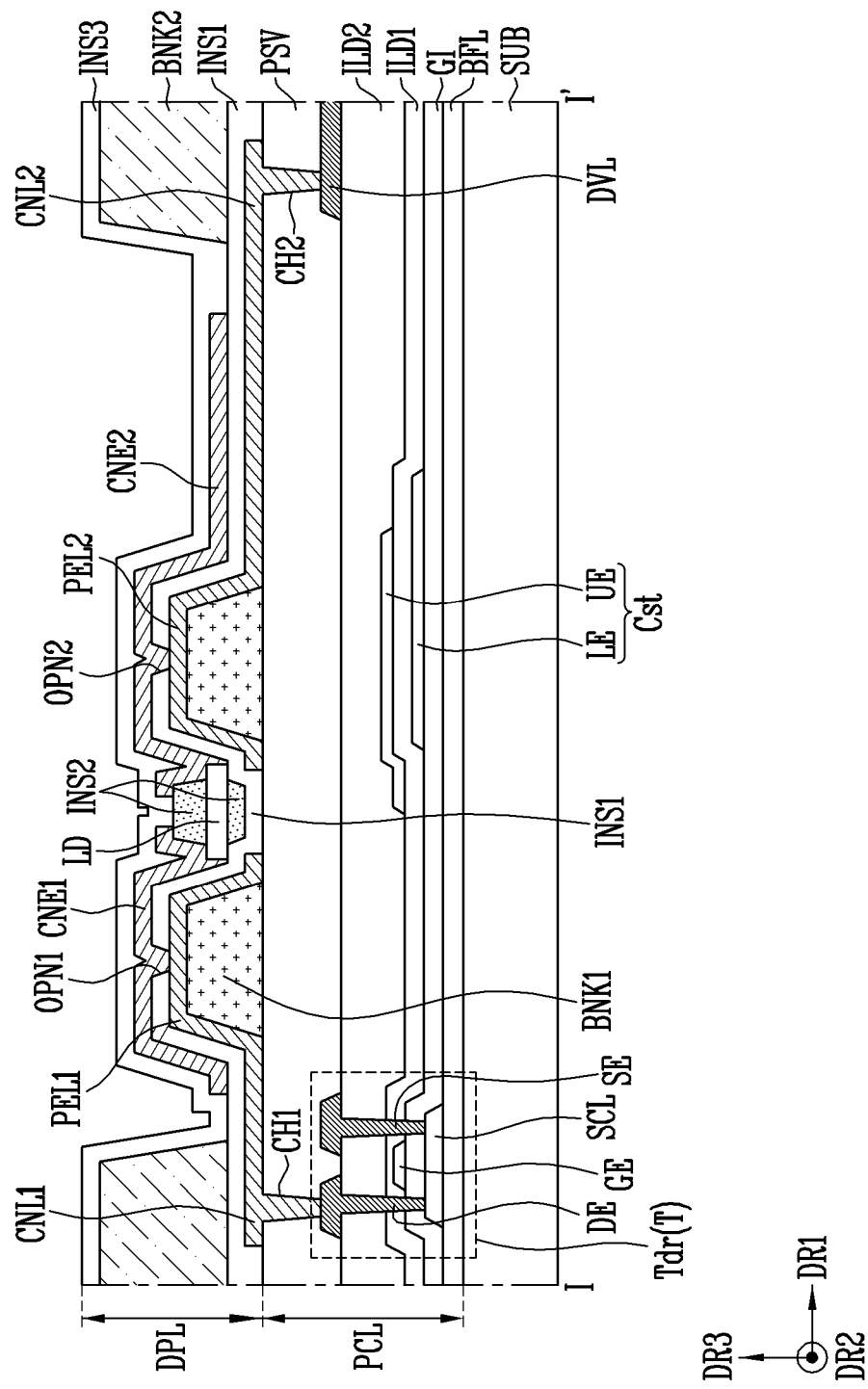

FIG. 11 is a schematic cross-sectional view taken along line I-I' of FIG. 10.

Figure 12:
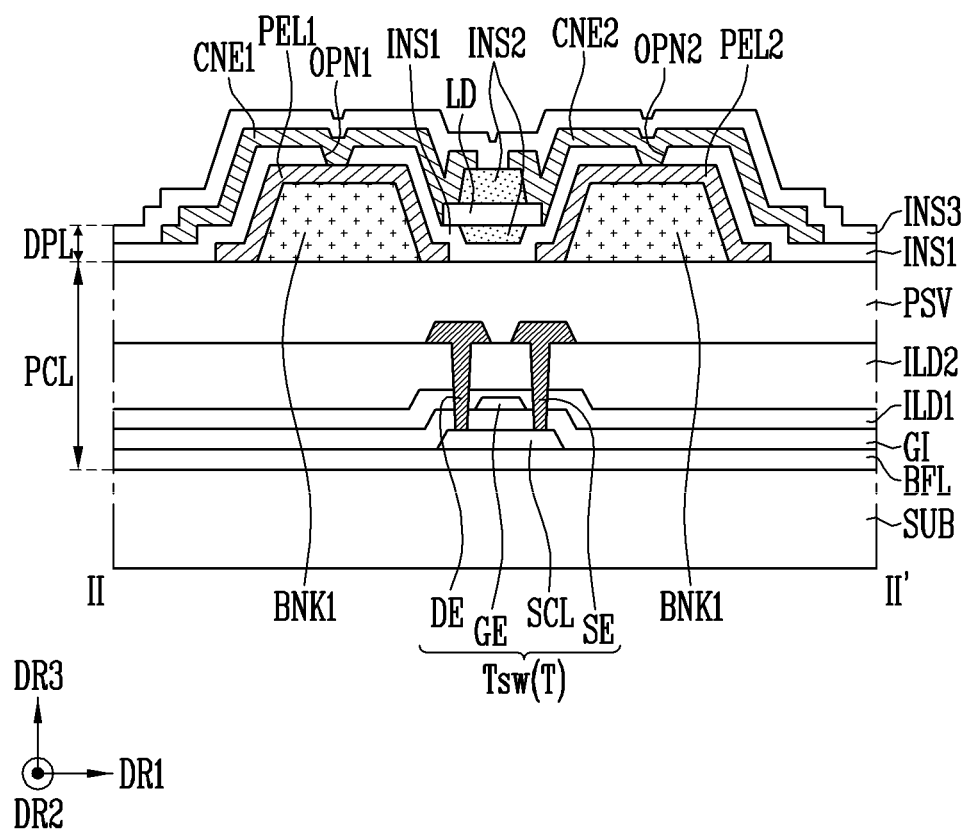

FIG. 12 is a schematic cross-sectional view taken along line II-II' of FIG. 10.

Figure 13:
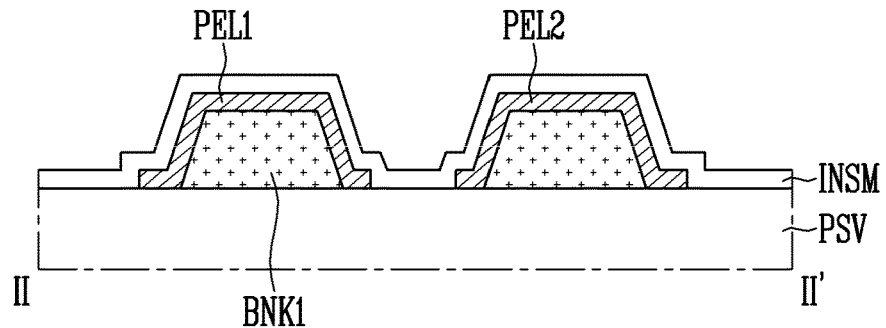
Figure 14:
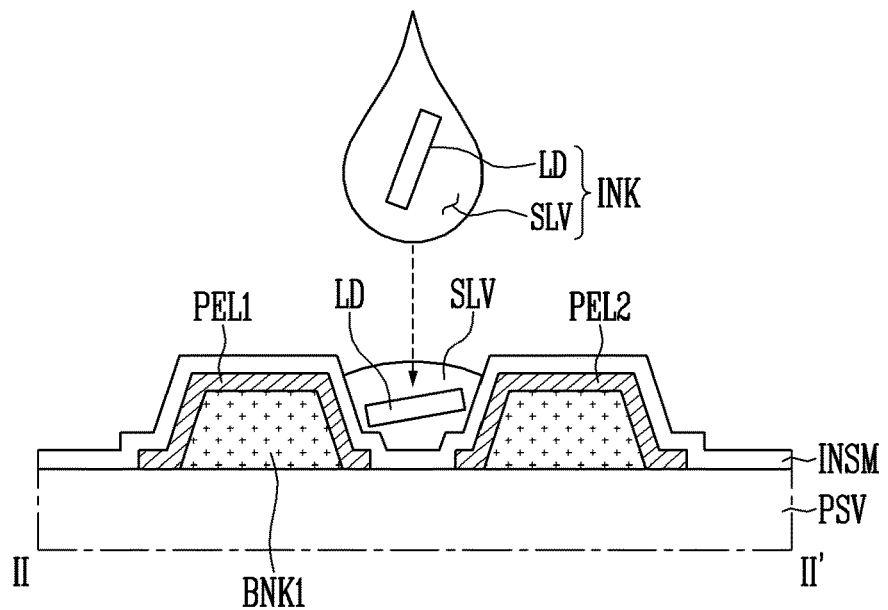
Figure 15:
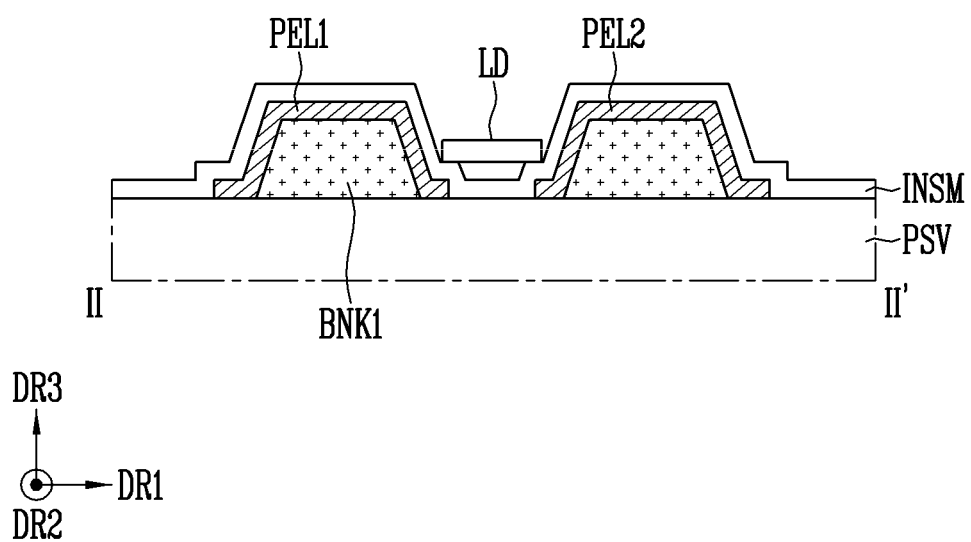

FIG. 13 to FIG. 15 are schematic cross-sectional views illustrating process steps of a method of fabricating a display device according to an embodiment.

DETAILED DESCRIPTION

Because the subject matter of the present disclosure may be variously modified and have various forms, embodiments will be illustrated and described in more detail in the following. This, however, by no means restricts the disclosure to the disclosed embodiments, and it is to be understood as embracing all changes, equivalents, and substitutes included in the spirit and scope of the present disclosure.

Like reference numerals are used for like constituent elements in describing each drawing. In the accompanying drawings, the dimensions of the structure may be exaggerated and shown for clarity of the present disclosure. Terms such as first, second, and the like will be used only to describe various constituent elements, and are not to be interpreted as limiting these constituent elements. The terms are only used to differentiate one constituent element from other constituent elements. For example, a first constituent element could be termed a second constituent element, and similarly, a second constituent element could be termed as a first constituent element, without departing from the spirit and scope of the present disclosure. Singular forms are intended to include plural forms unless the context clearly indicates otherwise.

In the present application, it should be understood that the term "include", "comprise", "have", or "configure" indicates that a feature, a number, a step, an operation, a constituent element, a part, or a combination thereof described in the specification is present, but does not exclude a possibility of presence or addition of one or more other features, numbers, steps, operations, constituent elements, parts, or combinations, in advance. It will be understood that when an element such as a layer, film, region, area, or substrate is referred to as being "on" another element, it can be directly on the other element or intervening elements may also be present. In addition, in the present specification, when an element of a layer, film, region, plate, or the like is referred to as being formed "on" another element, the formed direction is not limited to an upper direction but includes a lateral or lower direction. In contrast, when an element of a layer, film, region, plate, or the like is referred to as being "below" another element, it may be directly below the other element, or intervening elements may be present.

It is to be understood that, in the present application, when it is described for one constituent element (for example, a first constituent element) to be (functionally or communicatively) "coupled or connected with/to" another constituent element (for example, a second constituent element), the one constituent element may be directly coupled or connected with/to the another constituent element, or may be coupled or connected with/to through the other constituent element (for example, a third constituent element). In contrast, it is to be understood that when it is described for one constituent element (for example, a first constituent element) to be "directly coupled or connected with/to" another constituent element (for example, a second constituent element), there is no other constituent element (for example, a third constituent element) between the one constituent element and the another constituent element.

Hereinafter, with reference to accompanying drawings, an example embodiment of the present disclosure and others required for those skilled in the art to understand the contents of the present disclosure will be described in more detail. In the description below, singular forms are to include plural forms unless the context clearly indicates only the singular.

Figure 1:
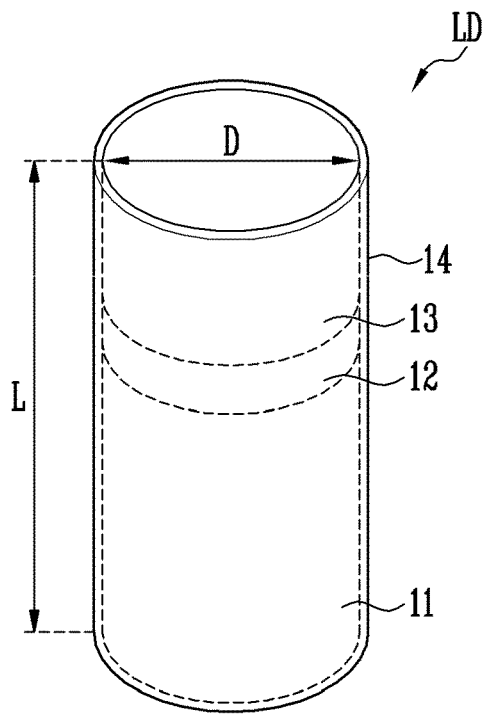
FIG. 1 is a schematic perspective view of a light emitting element according to an embodiment.
Figure 2:
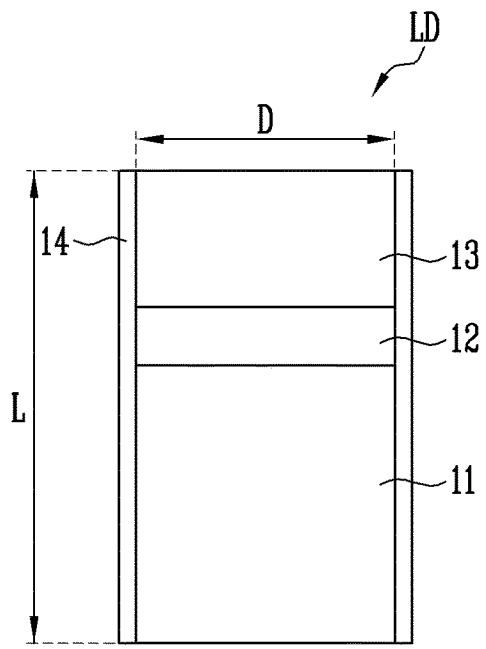
FIG. 2 is a cross-sectional view of the light emitting element of FIG. 1.

FIG. 1 is a schematic perspective view of a light emitting element according to an embodiment, and FIG. 2 is a cross-sectional view of the light emitting element of FIG. 1.

In one or more embodiments of the present disclosure, a type or kind and/or shape of the light emitting element is not limited to embodiments shown in FIG. 1 and FIG. 2.

Referring to FIG. 1 and FIG. 2, a light emitting element LD may include a first semiconductor layer 11, a second semiconductor layer 13, and an active layer 12 interposed between the first and second semiconductor layers 11 and 13. For example, the light emitting element LD may be implemented as a stacked light emitting body in which the first semiconductor layer 11, the active layer 12, and the second semiconductor layer 13 are sequentially stacked.

The light emitting element LD may be provided to have a shape extending in one direction. When the extending direction of the light emitting element LD is a length direction, the light emitting element LD may include one end portion (or lower end portion) and the other end portion (or upper end portion) along the extending direction. One of the first and second semiconductor layers 11 and 13 may be included at one end portion (or lower end portion) of the light emitting element LD, and the remaining semiconductor layers of the first and second semiconductor layers 11 and 13 may be included at the other end portion (or upper end portion) of the light emitting element LD. For example, the first semiconductor layer 11 may be included at one end portion (or lower end portion) of the light emitting element LD, and the second semiconductor layer 13 may be included at the other end portion (or upper end portion) of the light emitting element LD.

The light emitting element LD may be provided in various suitable shapes. For example, the light emitting element LD may have a rod-like shape or a bar-like shape that is long in the length direction (e.g., an aspect ratio is greater than 1). In one or more embodiments of the present disclosure, a length L of the light emitting element LD in the length direction may be larger than a diameter D thereof (or a width of a cross-section thereof). For example, the light emitting element LD may include a light emitting diode (LED) manufactured to have an ultra-small size having the diameter D and/or the length L of a nano scale to a micro scale.

The diameter D of the light emitting element LD may be about 0.5 μm to 500 μm, and the length L thereof may be about 1 μm to 10 μm. However, the diameter D and the length L of the light emitting element LD are not limited thereto, and the size of the light emitting element LD may be changed so that the light emitting element LD meets requirements (or design conditions) of a lighting device or a self-luminous display device to which the light emitting element LD is applied.

For example, the first semiconductor layer 11 may include at least one n-type semiconductor layer. For example, the first semiconductor layer 11 may include a semiconductor material of one selected from InAlGaN, GaN, AlGaN, InGaN, AlN, and InN, and may be a n-type semiconductor layer doped with a first conductive dopant (or n-type dopant) such as Si, Ge, Sn, and/or the like. However, the material included in the first semiconductor layer 11 is not limited thereto, and the first semiconductor layer 11 may be made of various suitable materials. In one or more embodiments of the present disclosure, the first semiconductor layer 11 may include a gallium nitride (GaN) semiconductor material doped with the first conductive dopant (or n-type dopant). The first semiconductor layer 11 may include an upper surface contacting (e.g., physically contacting) the active layer 12 along the direction of the length L of the light emitting element LD and a lower surface exposed to the outside. The lower surface of the first semiconductor layer 11 may be one end portion (or lower end portion) of the light emitting element LD.

The active layer 12 is on the first semiconductor layer 11, and may be formed to have a single or multi-quantum well structure. For example, when the active layer 12 is formed of a multi-quantum well structure, the active layer 12 may have a structure in which a barrier layer, a strain reinforcing layer, and a well layer, which include (or consist of) one unit, are periodically and repeatedly stacked. Because the strain reinforcing layer has a smaller lattice constant than that of the barrier layer, it may further reinforce strain applied to the well layer, for example, compressive strain. However, the structure of the active layer 12 is not limited to the above-described embodiment.

The active layer 12 may emit light having a wavelength of 400 nm to 900 nm, and may have a double heterostructure. In one or more embodiments of the present disclosure, a cladding layer doped with a conductive dopant may be formed on upper and/or lower portions of the active layer 12 along the direction of the length L of the light emitting element LD. For example, the clad layer may be formed as an AlGaN layer and/or an InAlGaN layer. In some embodiments, a material such as AlGaN and/or InAlGaN may be used to form the active layer 12, and in addition, various suitable materials may form the active layer 12. The active layer 12 may include a first surface contacting (e.g., physically contacting) the first semiconductor layer 11 and a second surface contacting (e.g., physically contacting) the second semiconductor layer 13.

When an electric field of a set or predetermined voltage or more is applied to respective end portions of the light emitting element LD, the light emitting element LD emits light while electron-hole pairs are combined in the active layer 12. By controlling the light emission of the light emitting element LD by using this principle, the light emitting element LD may be used as a light source (or light emitting source) for various suitable light emitting devices.

The second semiconductor layer 13 is on the second surface of the active layer 12, and may include a semiconductor layer of a type or kind different from that of the first semiconductor layer 11. For example, the second semiconductor layer 13 may include at least one p-type semiconductor layer. For example, the second semiconductor layer 13 may include at least one semiconductor material selected from InAlGaN, GaN, AlGaN, InGaN, AlN, and InN, and may include a p-type semiconductor layer doped with a second conductive dopant (or p-type dopant) such as Mg. However, the material included in the second semiconductor layer 13 is not limited thereto, and the second semiconductor layer 13 may be formed of various suitable materials. In one or more embodiments of the present disclosure, the second semiconductor layer 13 may include a gallium nitride (GaN) semiconductor material doped with the second conductive dopant (or p-type dopant). The second semiconductor layer 13 may include a lower surface contacting (e.g., physically contacting) the second surface of the active layer 12 along the length L direction of the light emitting element LD and an upper surface exposed to the outside. Here, the upper surface of the second semiconductor layer 13 may be the other end portion (or upper end portion) of the light emitting element LD.

In one or more embodiments of the present disclosure, the first semiconductor layer 11 and the second semiconductor layer 13 may have different thicknesses from each other in the length L direction of the light emitting element LD. For example, the first semiconductor layer 11 may have a relatively thicker thickness than that of the second semiconductor layer 13 along the length L direction of the light emitting element LD. Accordingly, the active layer 12 of the light emitting element LD may be closer to the upper surface of the second semiconductor layer 13 than the lower surface of the first semiconductor layer 11.

It is illustrated that each of the first semiconductor layer 11 and the second semiconductor layer 13 are formed as one layer, but the present disclosure is not limited thereto. In one or more embodiments of the present disclosure, each of the first semiconductor layer 11 and the second semiconductor layer 13 may further include at least one or more layers, for example, a cladding layer and/or a tensile strain barrier reducing (TSBR) layer according to the material of the active layer 12. The TSBR layer may be a strain reducing layer between semiconductor layers having different lattice structures and serving as a buffer to reduce a difference in lattice constant. The TSBR layer may be formed of a p-type semiconductor layer such as p-GaInP, p-AlInP, and/or p-AlGaInP, but the present disclosure is not limited thereto.

In some embodiments, the light emitting element LD may further include an additional electrode (hereinafter referred to as a "first additional electrode") on the second semiconductor layer 13 in addition to the first semiconductor layer 11, the active layer 12, and the second semiconductor layer 13 described above. In addition, in another embodiment, another additional electrode (hereinafter referred to as a "second additional electrode") on one end of the first semiconductor layer 11 may be further included.

Each of the first and second additional electrodes may be an ohmic contact electrode, but the present disclosure is not limited thereto. In some embodiments, the first and second additional electrodes may be a Schottky contact electrode. The first and second additional electrodes may include a conductive material (or substance, for example, an electrically conductive material or substance). For example, the first and second additional electrodes may include an opaque metal in which chromium (Cr), titanium (Ti), aluminum (Al), gold (Au), nickel (Ni), an oxide thereof, and/or alloy thereof are used alone or in combination, but the present disclosure is not limited thereto. In some embodiments, the first and second additional electrodes may include a transparent conductive oxide such as an indium tin oxide (ITO), an indium zinc oxide (IZO), a zinc oxide (ZnO), an indium gallium zinc oxide (IGZO), and/or an indium tin zinc oxide (ITZO).

Materials included in the first and second additional electrodes may be the same or different from each other. The first and second additional electrodes may be substantially transparent or translucent. Accordingly, light generated by the light emitting element LD may transmit through each of the first and the second additional electrodes to be outputted to the outside of the light emitting element LD. In some embodiments, when the light generated by the light emitting element LD does not transmit through the first and the second additional electrodes and is discharged to the outside through an area excluding respective end portions of the light emitting element LD, the first and the second additional electrodes may include an opaque metal.

In one or more embodiments of the present disclosure, the light emitting element LD may further include an insulation film 14. However, in some embodiments, the insulation film 14 may be omitted, or it may be provided so as to cover only some of the first semiconductor layer 11, the active layer 12, and the second semiconductor layer 13.

The insulation film 14 may prevent an electrical short circuit that may occur when the active layer 12 contacts (e.g., physically contacts) conductive materials (e.g., electrically conductive materials) other than the first and second semiconductor layers 11 and 13 (or may reduce a likelihood or degree of such a short circuit). In addition, the insulation film 14 may minimize or reduce surface defects of the light emitting element LD to improve lifespan and luminous efficiency of the light emitting element LD. In addition, when a plurality of light emitting elements LD are located closely to each other, the insulation film 14 may prevent unwanted short-circuits that may occur between the light emitting elements LD (or may reduce a likelihood or degree of such short circuits). As long as the active layer 12 may prevent a short circuit with an external conductive material (e.g., an external, electrically conductive material) from being caused (or may reduce a likelihood or degree of such a short circuit), whether or not the insulation film 14 is provided is not limited.

The insulation film 14 may be provided in a form that entirely surrounds an outer peripheral surface (e.g., an outer circumferential surface) of a light emitting stacked structure including the first semiconductor layer 11, the active layer 12, and the second semiconductor layer 13. An outer peripheral surface (e.g., an outer circumferential surface) of the insulation film 14 is surface-treated, so that an element coupler may be coupled to at least a portion of a surface thereof. The element coupler may stably fix the light emitting element LD in a desired area when a device to which the light emitting element LD is applied, for example, a display device, is manufactured.

In the above-described embodiment, the structure in which the insulation film 14 entirely surrounds the outer peripheral surfaces (e.g., the outer circumferential surfaces) of the first semiconductor layer 11, the active layer 12, and the second semiconductor layer 13 is described, but the present disclosure is not limited thereto. In some embodiments, when the light emitting element LD includes a first additional electrode, the insulation film 14 may entirely surround the outer peripheral surface (e.g., the outer circumferential surface) each of the first semiconductor layer 11, the active layer 12, the second semiconductor layer 13, and the first additional electrode. In addition, according to another embodiment, the insulation film 14 may not entirely surround the outer peripheral surface (e.g., an outer circumferential surface) of the first additional electrode, or may only surround a portion of the outer peripheral surface (e.g., the outer circumferential surface) of the first additional electrode and may not surround the remaining portion of the outer peripheral surface (e.g., the outer circumferential surface) of the first additional electrode. In addition, in some embodiments, when the first additional electrode is included at the other end portion (or an upper end portion) of the light emitting element LD and a second additional electrode is included at one end portion (or a lower end portion) of the light emitting element LD, the insulation film 14 may expose at least one area of each of the first and second additional electrodes.

The insulation film 14 may include a transparent insulation material. For example, the insulation film 14 may be formed as a single layer or multilayer (for example, a double layer made of an aluminum oxide ($AlO_x$) and a silicon oxide ($SiO_x$)) by including at least one insulation material of a silicon oxide ($SiO_x$), a silicon nitride ($SiN_x$), a silicon oxynitride ($SiO_xN_y$), an aluminum oxide ($AlO_x$), and a titanium oxide ($TiO_2$), but is not limited thereto. For example, in one or more embodiments of the present disclosure, various suitable materials having insulation properties may be used as the material of the insulation film 14.

In some embodiments, the light emitting element LD may be implemented in a light emitting pattern having a core-shell structure. In this case, the above-described first semiconductor layer 11 may be positioned at a core, for example, a middle (or center) of the light emitting element LD, and the active layer 12 may surround the outer peripheral surface (e.g., the outer circumferential surface) of the first semiconductor layer 11, and the second semiconductor layer 13 may be provided and/or formed to surround the active layer 12. In addition, the light emitting element LD may further include an additional electrode surrounding at least one side of the second semiconductor layer 13. In addition, in some embodiments, the light emitting element LD may further include the insulation film 14 provided on the outer peripheral surface (e.g., the outer circumferential surface) of the light emitting pattern having a core-shell structure and including a transparent insulation material. The light emitting element LD implemented in the light emitting pattern having the core-shell structure may be manufactured by a growth method.

The light emitting element LD described above may be used as a light emitting source of various suitable display devices. The light emitting element LD may be manufactured through a surface treatment process. For example, when the plurality of light emitting elements LD are mixed with a fluid solution (or a solvent) and supplied to each pixel area (for example, a light emitting area of each pixel or a light emitting area of each sub pixel), each light emitting element LD may be surface-treated so that the light emitting elements LD may be non-uniformly aggregated in the solution and may be uniformly (e.g., substantially uniformly) sprayed.

A light emitting unit (or light emitting device) including the above-described light emitting element LD may be used in various suitable types or kinds of electronic devices that require a light source in addition to the display device. For example, when a plurality of light emitting elements LD are in a pixel area of each pixel of a display panel, the light emitting elements LD may be used as a light source of each pixel. However, an application field of the light emitting element LD is not limited to the above-described example. For example, the light emitting element LD may be used in other suitable types or kinds of electronic devices that use or require a light source, such as a lighting device.

FIG. 3 is a schematic side cross-sectional view of a reservoir of light emitting elements according to an embodiment, 4A is a schematic perspective view of a storage part included in the reservoir of FIG. 3, FIG. 4B is a side cross-sectional view of electrodes included in the storage part of FIG. 4A, and FIG. 4C is a schematic perspective view of another example of a storage part included in the reservoir of FIG. 3.

In FIG. 3, FIG. 4A, FIG. 4B, and FIG. 4C, for better comprehension and ease of description, the light emitting elements LD are illustrated in a cylindrical shape, but the present disclosure is not limited thereto.

First, referring to FIG. 1 to FIG. 4B, a reservoir 100 of a light emitting element (hereinafter, referred to as a reservoir 100) according to an embodiment may include a storage part 110 and a power supplier 120.

The storage part 110 may include a storage container 110a for accommodating (or storing) a material INK (or mixture, contents) and an electric field former for forming an electric field in the material INK.

The material INK may be provided in a solution state. The material INK may be an ink including a fluid solvent SLV and a plurality of light emitting elements LD included (or dispersed) in the solvent SLV.

The solvent SLV is a liquid or a fluid, and may have a viscosity such that the light emitting elements LD corresponding to a dispersion material may move in the solvent SLV. The solvent SLV may include a material in which the light emitting elements LD may be easily moved in the solvent SLV by an electric field formed by an electric field former. As an example, the solvent SLV may include acetone, water, alcohol, toluene, etc., but the present disclosure is not limited thereto. In some embodiments, the solvent SLV may include at least one of materials that are vaporized and/or volatilized by room temperature (e.g., 25° C.) and/or heat (e.g., added heat that raises the temperature above 25° C.). In some embodiments, the solvent SLV may include an organic resin. For example, the organic resin may be used as one or a combination of two or more selected from a thermo-baking resin, a thermo-curable resin, and a photo-curable resin.

The light emitting elements LD may be solid materials that finally remain on an object (for example, a substrate) after the solvent SLV is removed. The light emitting elements LD may be ultra-small light emitting diodes having a nano scale to micro scale as described with reference to FIG. 1 and FIG. 2. Each of the light emitting elements LD may include a first end portion and a second end portion in the length L direction. One of the first and second semiconductor layers 11 and 13 may be included at the first end portion, and the other of the first and second semiconductor layers 11 and 13 may be included at the second end portion. Accordingly, the first and second end portions may have different polarities. When an electric field is formed in the storage container 110a, each of the light emitting elements LD having different polarities at the first and second end portions may be applied with electric force (for example, attractive force and repulsive force) to maintain a floating state (e.g., a dispersed state) without (or substantially without) sedimentation in the solvent SLV.

The storage container 110a may be a storage space for accommodating the above-described material INK. The storage container 110a is shown in a form having a quadrangular cross-section, but the present disclosure is not limited thereto, and it may be changed into various suitable shapes within a range in which an electric field former may be stably therein while accommodating the material INK.

The storage container 110a may be made of a nonconductor material (or substance), for example an insulation material (e.g., an electrically insulating material or substance). The storage container 110a may selectively include at least one of a transparent insulation material and/or an opaque insulation material according to embodiments.

The storage container 110a may include an inflow part 110b through which the material INK is introduced and a discharge part 110c through which the material INK is discharged. The inflow part 110b and the discharge part 110c may be in direct fluid communication with a corresponding conduit. Each of the inflow part 110b and the discharge part 110c may be positioned at a side surface of the storage container 110a. For example, the inflow part 110b may be positioned at a first side surface S3 of the storage container 110a, and the discharge part 110c may be positioned at a second side surface S4 of the storage container 110a. Here, the first side surface S3, as seen in FIG. 4A, may be a left side surface of the storage container 110a, and the second side surface S4 may be a right side surface of the storage container 110a, but the present disclosure is not limited thereto.

The storage part 110 may further include a check valve positioned between the inflow part 110b and a conduit corresponding to the inflow part 110b. The check valve may be selectively opened and closed to prevent or reduce introduction of the material INK of a set or certain level or more into the storage container 110a. In addition, the storage part 110 may further include a supply valve positioned between the discharge part 110c and a conduit corresponding to the charge part 110c. The supply valve may be selectively opened and closed to supply the material INK accommodated in the storage container 110a to an object, for example, a printing apparatus.

The electric field former may include a first electrode EL1 and a second electrode EL2 that are inside the storage container 110a and spaced apart from each other.

The first electrode EL1 and the second electrode EL2 may contain a conductive material (or substance, e.g., an electrically conductive material or substance). A width of the first electrode EL1 (for example, a length in a second direction DR2 in FIG. 4A) and a width of the second electrode EL2 (for example, a length in the second direction DR2 in FIG. 4A) may be the same. The first electrode EL1 and the second electrode EL2 may have the same (e.g., substantially the same) planar shape. For example, as shown in FIG. 4A and FIG. 4B, the first electrode EL1 and the second electrode EL2 respectively have a plate shape, and may completely overlap each other in a first direction DR1.

In the embodiments, the first electrode EL1 and the second electrode EL2 may be alternately included along a direction perpendicular (e.g., substantially perpendicular) to surfaces of the first and second electrodes EL1 and EL2 with a set or predetermined gap GAP therebetween.

As shown in FIG. 4A and FIG. 4B, each of the first electrode EL1 and the second electrode EL2 has a plate shape parallel (e.g., substantially parallel) to a plane defined by the second direction DR2 and a third direction DR3, and the first electrode EL1 and the second electrode EL2 may be alternately included along the first direction DR1. Here, the first direction DR1 may be perpendicular (e.g., substantially perpendicular) to the direction of gravity. The first electrode EL1 and the second electrode EL2 may extend from a lower surface S1 to an upper surface S2 of the storage container 110a. The gap GAP (e.g., a distance in the first direction DR1) between the first electrode EL1 and the second electrode EL2 adjacent to each other may be 10 μm to 1000 μm. In this case, the material INK moves with an appropriate or suitable flow rate and flow amount between the first electrode EL1 and the second electrode EL2 by electroosmosis, and may be stirred by a vortex formed between the first electrode EL1 and the second electrode EL2. In FIG. 4A and FIG. 4B, a total of four first and second electrodes EL1 and EL2 are illustrated, but this is an example, and the storage part 110 may include five or more of first and second electrodes EL1 and EL2.

In the embodiments, holes HOLE penetrating through the first electrode EL1 in a thickness direction may be formed in the first electrode EL1. Similarly, holes penetrating through the second electrode EL2 in the thickness direction may be formed in the second electrode EL2.

In the embodiment, the HOLE may have a diameter DM of 1 μm to 20 μm. In some embodiments, the diameter of the hole HOLE may be larger than the length L of the light emitting element LD, and in this case, the material INK including the light emitting element LD may move through the hole HOLE.

For reference, microbubbles BB may occur in a process of supplying the material INK to the storage part 110, and/or electrolytic separation may occur due to an electric field (or electric field) formed between the first and second electrodes EL1 and EL2, so that the microbubbles BB may occur. The microbubbles BB may have a size of about 50 μm or less, and may prevent or reduce supply of the material INK (for example, light emitting element LD) to the outside through the discharge part 110c to a set or certain level. For example, the material INK may not be supplied from the storage part 110 due to the microbubbles BB. Therefore, by forming the holes HOLE in the first and second electrodes EL1 and EL2, the microbubbles BB together with the material INK passes the hole HOLE by the electric field between the first and second electrodes EL1 and EL2, so that the microbubbles BB may burst to be removed in the process of passing through the hole.

The power supplier 120 (e.g., the power supply 120 or power source 120) may include a signal applier 120a and a signal amplifier 120b.

The signal applier 120a may be a power supplier (e.g., a power supply or power source) that applies a signal corresponding to each of the first and second electrodes EL1 and EL2 to form an electric field between the first electrode EL1 and the second electrode EL2.

The signal amplifier 120b may amplify a set or predetermined signal supplied from the signal applier 120a to a set or predetermined level or higher to transmit the amplified signal to the first and second electrodes EL1 and EL2 through first and second wires CL1 and CL2. The signal amplifier 120b may transmit a set or predetermined signal amplified through the first wire CL1 to the first electrode EL1, and may transmit a set or predetermined signal amplified through the second wire CL2 to the second electrode EL2.

The set or predetermined signal applied to the first electrode EL1 and the set or predetermined signal applied to the second electrode EL2 may be signals having a voltage difference and/or a phase difference sufficient to form an electric field between the first and second electrodes EL1 and EL2. For example, the set or predetermined signal applied to each of the first and second electrodes EL1 and EL2 may be a voltage in a range from 1 V to 100 V. The set or predetermined signal applied to each of the first and second electrodes EL1 and EL2 may be a DC voltage and/or an AC voltage such a sine wave, a sawtooth wave, a square wave, or a triangle wave. When the set or predetermined signal applied to each of the first and second electrodes EL1 and EL2 is an AC voltage, a frequency of the signal may be 1 Hz to 100 kHz. However, the present disclosure is not limited thereto, and an intensity and frequency of the set or predetermined signal applied to each of the first and second electrodes EL1 and EL2 may be determined according to a material and thickness of the storage container 110a, a viscosity of the material INK including the light emitting elements LD, and a concentration of the light emitting elements LD.

The intensity and frequency of the set or predetermined signal applied to each of the first and second electrodes EL1 and EL2 may be discharged from the discharge part 110c of the storage part 110 to an object through a corresponding conduit to be continuously changed with an aging property according to an amount of the material INK remaining in the storage container 110a.

The light emitting elements LD in the storage container 110a in which the material INK is accommodated may have a random orientation direction when no external force is applied thereto, and may be sunk toward a bottom surface of the storage container 110a (or, the lower surface S1 of the storage container 110a) by gravity. When the material INK is stored for a long time in the storage part 110, the light emitting elements LD may be sunk to be aggregated on a bottom surface of the storage container 110a. In this case, when the material INK is discharged to a target object through the discharge part 110c and the corresponding conduit, due to a concentration gradient of particles (for example, the light emitting elements LD) in the material INK, the light emitting elements LD are aggregated in a set or specific area so that flow of the material INK is not smooth, and thus discharge of an appropriate or suitable amount of the material INK in a desired area may become impossible or discharging accuracy may be degraded.

Accordingly, by having the first and second electrodes EL1 and EL2 face each other in the storage container 110a, and by applying a set or predetermined signal corresponding to each of the first and second electrodes EL1 and EL2 through the power supplier 120, an electric field may be formed between the first electrode EL1 and the second electrode EL2. In this case, as shown in FIG. 4B, the solvent SLV may move and the material INK may be stirred by electroosmosis.

As used herein, the term "electroosmosis" refers to a phenomenon in which in an uneven electric field, ions in a fluid form a thin electric double layer at an electrode surface and a liquid interface, and a fluid moves along an electrode surface in a direction where an electric field is strong due to influence of a tangential electric field formed by a voltage.

For example, as shown in FIG. 4B, by electroosmosis, the solvent SLV may flow in the first direction DR1 at an arbitrary point (for example, a portion in which the hole HOLE is not formed) of the first electrode EL1 (for example, an upward flow based on the first electrode EL1), and the solvent SLV may flow in a direction opposite to the first direction DR1 at another point (for example, a portion in which the hole HOLE is not formed) of the first electrode EL1 (for example, a downward flow based on the first electrode EL1). Accordingly, a flow of the solvent SLV such as a vortex may occur between the first electrode EL1 and the second electrode EL2. The light emitting element LD may flow according to the flow of the solvent SLV, and the material INK including the light emitting element LD may be stirred.

An intensity of the electric field may be set to about several mV to several kV depending on a size of the light emitting elements LD in the material INK, a viscosity of the solvent SLV in the material INK, and a temperature of the storage container 110a, but the present disclosure is not limited thereto.

The reservoir 100 may apply a set or predetermined signal corresponding to each of the first and second electrodes EL1 and EL2 during a period in which the material INK is accommodated in the storage container 110a to continuously generate an electric field between the first and second electrodes EL1 and EL2. However, the present disclosure is not limited to the above-described embodiment, and in some embodiments, the reservoir 100 may periodically change a polarity of the set or predetermined signal applied to the first electrode EL1 and a polarity of the set or predetermined signal applied to the second electrode EL2.

In one or more embodiments, because each of the light emitting elements LD included in the material INK is provided in a form of a dipole having different polarities at respective end portions thereof, it may be affected by the electric field and thus flow in the solvent SLV along an electric field direction. For example, the light emitting elements LD may maintain a floating state (e.g., a dispersed state) in the solvent SLV.

As the light emitting elements LD maintain the floating state (e.g., the dispersed state), when the material INK is discharged from the storage part 110 and moves to a target object, it may not (or substantially may not) be blocked or aggregated in a set or specific area. Accordingly, the material INK may smoothly move to the object, and an appropriate or suitable amount of the material INK may be ejected in a desired area, so that an ejection accuracy of the object may be improved.

In addition, because a separate mechanical stirring member such as a centrifugal pump (impeller) is not used, it is possible to prevent or reduce production of particles (e.g., microscopic pieces that may cause defects) during, or as a result of, a process of stirring the material INK by the mechanical stirring member.

Additionally, by forming holes in the first and second electrodes EL1 and EL2, the microbubbles BB may be removed (or substantially removed), and a phenomenon that the material INK is not discharged due to the microbubbles BB may be eliminated (or substantially eliminated).

In FIG. 4A and FIG. 4B, it has been described that the first electrode EL1 and the second electrode EL2 are alternately included in the first direction DR1, but the present disclosure is not limited thereto.

In another embodiment, as shown in FIG. 4C, a storage part 110_1 may include a first electrode EL1_1 and a second electrode EL2_1, each of the first electrode EL1_1 and the second electrode EL2_1 may have a plate shape parallel (e.g., substantially parallel) to a plane defined by the first direction DR1 and the second direction DR2, and the first electrode EL1_1 and the second electrode EL2_1 may be alternately included along the third direction DR3. Here, the third direction DR3 may be perpendicular (e.g., substantially perpendicular) to the direction of gravity. By continuously forming an electric field in a vertical direction in the storage container 110a by applying a corresponding signal to each of the first and second electrodes EL1_1 and EL2_1, the light emitting elements LD may be maintained in a floating state (e.g., a dispersed state) without (or substantially without) sinking. For example, each of the light emitting elements LD provided in a form of a dipole flows in the solvent SLV so that a length (see 'L' in FIG. 4B) direction thereof is parallel (e.g., substantially parallel) to an electric field formation direction, so that it may not be sunk toward a bottom surface of the storage container 110a.

FIG. 4C is a schematic side cross-sectional view of another example of a storage part included in the reservoir of FIG. 3.

Referring to FIG. 3 and FIG. 5, except for inclusion of a first electrode EL1_2 and a second electrode EL2_2, a storage part 110_2 of FIG. 5 may be substantially the same as or similar to the storage part 110 described above with reference to FIG. 3. Therefore, a duplicated description thereof will not be repeated here.

Each of the first electrode EL1_2 and the second electrode EL2_2 has a plate shape perpendicular (e.g., substantially perpendicular) to the third direction DR3, and is adjacent to the lower surface S1 of the storage container 110a inside the inside of the storage container 110a, and in this case, the first electrode EL1_2 and the second electrodes EL2_2 may be spaced apart from each other along the first direction DR1. Here, the third direction DR3 may be a direction of gravity, and the first direction DR1 may be a direction parallel (e.g., substantially parallel) to planes of the first and second electrodes EL1_2 and EL2_2. For example, the first electrode EL1_2 and the second electrode EL2_2 may be spaced apart from each other on the same plane.

When the power supplier 120 applies a set or predetermined signal to the first and second electrodes EL1_2 and EL2_2, an electric field may be formed between the first and second electrodes EL1_2 and EL2_2.

In this case, the solvent SLV may move in a direction in which the electric field is strong along surfaces of the first and second electrodes EL1_2 and EL2_2 by electroosmosis, and as shown in FIG. 5, the solvent SLV may upwardly flow at a central area of each of the first and second electrodes EL1_2 and EL2_2 in which the electric field is relatively strong, while the solvent SLV may downwardly flow between the first and second electrodes EL1_2 and EL2_2 in which the electric field is relatively weak. A flow of the solvent SLV such as a vortex occurs inside the storage container 110a, and the material INK including the light emitting element LD may be stirred according to the flow of the solvent SLV.

As the material INK is stirred, the material INK may not (or substantially may not) be blocked or aggregated in a set or specific area when it is discharged from the storage part 110_2 and moves to a target object. Accordingly, the material INK may smoothly move to the object, and an appropriate or suitable amount of the material INK may be ejected in a desired area, so that an ejection accuracy of the object may be improved.

In one or more embodiments, as described above with reference to FIG. 4A to FIG. 4C, holes may be formed in the first and second electrodes EL1_2 and EL2_2. In this case, the microbubbles BB may be removed (or substantially removed) while passing through the hole during the stirring process of the material INK.

As described above, the first electrode EL1_2 and the second electrode EL2_2 may be spaced apart from each other on the same plane, and the material INK may be stirred by the electric field formed by the first electrode EL1_2 and the second electrode EL2_2, and thus the light emitting elements LD may not be sunk on the bottom surface of the storage container 110a.

FIG. 6 is a schematic side cross-sectional view of a printing apparatus according to an embodiment, and FIG. 7 is a schematic side cross-sectional view of a print head unit included in the printing apparatus of FIG. 6.

Referring to FIG. 3 to FIG. 7, a printing apparatus 1 according to an embodiment may include the reservoir 100 (or a storage unit, an ink supply unit) and a print head unit 500.

Because the reservoir 100 has been described with reference to FIG. 3 to FIG. 5, a duplicative description of the reservoir 100 will not be repeated here.

The reservoir 100 includes the storage container 110a containing the material INK including the light emitting element LD and the solvent SLV, and the first electrode EL1 and the second electrode EL2 that are included and spaced apart from each other in the storage container 110a. In one or more embodiments, holes may be formed in each of the first and second electrodes EL1 and EL2 as described above with reference to FIG. 4A to FIG. 4C. In addition, the reservoir 100 may further include a power supplier (see '120' of FIG. 3, e.g., a power supply 120 or a power source 120) applying a signal corresponding to each of the first and second electrodes EL1 and EL2. The power supplier 120 (e.g., the power supply 120 or power source 120) may apply a signal corresponding to each of the first electrode EL1 and the second electrode EL2 to form an electric field between the first electrode EL1 and the second electrode EL2. The material INK contained in the storage container 110a may be stirred by electroosmosis according to the electric field. Accordingly, the light emitting elements LD of the material INK contained in the storage container 110a of the reservoir 100 may not be sunk on the bottom surface of the storage container 110a by the electric field, and may flow within the solvent SLV of the material INK to maintain a floating state (e.g., a dispersed state).

The material INK maintaining the floating state (e.g., the dispersed state) may pass through a conduit SPL and move to a target object, for example, the print head unit 500 of the printing apparatus 1. In this case, as the light emitting elements LD maintain the floating state (e.g., the dispersed state), when the material INK moves from the reservoir 100 to the print head unit 500, it may not (or substantially may not) be aggregated or blocked in a set or specific area. Accordingly, the material INK may be smoothly moved from the reservoir 100 to the print head unit 500.

The conduit SPL may be an umbilical formed with a flexible hose with a single passage configured to be able to supply the material INK of the reservoir 100 to an inflow part of the print head unit 500, but the present disclosure is not limited thereto. In some embodiments, the conduit SPL may be provided in various suitable configurations within a range capable of stably supplying the material INK of the reservoir 100 to the print head unit 500.

The print head unit 500 may print the material INK on a target substrate SUB. The material INK supplied from the reservoir 100 may be sprayed (or ejected) toward the target substrate SUB through the print head unit 500. The print head unit 500 may be on a substrate support member SPM. In this case, the print head unit 500 may be mounted on a holder to be spaced apart from the substrate support member SPM by a set or predetermined distance.

The print head unit 500 may include a print head 510 and a plurality of nozzles 520 on a lower surface of the print head 510. The print head 510 may have an extended shape along one direction, but the present disclosure is not limited thereto. The print head 510 may include an inner tube 530 formed along an extension direction. The plurality of nozzles 520 may be arranged along the extension direction of the print head 510. Each nozzle 520 may be coupled to the inner tube 530 of the print head 510. The material INK is supplied to the inner tube 530 of the print head 510, and the material INK may flow along the inner tube 530 and then be sprayed (or ejected) through each nozzle 520. The material INK sprayed through each nozzle 520 may be supplied to an upper surface of the target substrate SUB. A sprayed amount of the material INK through each nozzle 520 may be adjusted according to a signal applied to the corresponding nozzle 520.

As described above, in the printing apparatus 1, by including the first electrode EL1 and the second electrode EL2, and forming an electric field in the storage container 110a that accommodates (or stores) the material INK including the light emitting elements LD, it is possible to smoothly move the material INK while preventing or reducing the sedimentation of the light emitting elements LD.

The material INK that is finally sprayed (or ejected) from the printing apparatus 1 onto the target substrate SUB may not contain a thickening additive or a high viscosity solvent used to increase dispersion stability of the light emitting elements LD contained therein. When the material INK containing the thickening additive or the high viscosity solvent is sprayed onto the target substrate SUB, the thickening additive or the high viscosity solvent may not be removed in a process of removing the solvent SLV contained in the material INK and may remain on the target substrate SUB. The residues may cause unexpected reactions in a subsequent process, causing physical and/or chemical damage to the target substrate SUB. For example, the residues interfere with adsorption and alignment of light emitting elements LD, or change the element characteristics of the light emitting elements LD to degrade reliability of a device to which the light emitting elements LD are applied as light sources.

Therefore, according to embodiments the disclosure, a pair of electrodes forming an electric field in a vertical direction on an outer surface of the storage container containing the material INK are included without containing the above-described thickening additive or the high viscosity solvent in the material INK including the light emitting elements LD, so that it is possible to improve the reliability of a device in which the light emitting elements LD are applied as a light source by reducing defects that may occur due to the thickening additive or the high viscosity solvent while preventing or reducing the sedimentation of the light emitting elements LD in the storage container.

The printing apparatus 1 and the reservoir 100 as described above may be used to manufacture a device in which the light emitting elements LD are applied as a light source, for example, a display device. Hereinafter, this will be described in more detail.

FIG. 8 is a schematic top plan view of a display device manufactured by a method according to an embodiment.

In FIG. 8, for convenience, a structure of the display device is briefly illustrated based on a display area DA on which an image is displayed.

Referring to FIG. 8, the display device according to an embodiment of the present disclosure may include a substrate SUB, a plurality of pixels PXL provided on the substrate SUB and respectively including at least one light emitting element LD, a driver provided on the substrate SUB and driving the pixels PXL, and a wire part coupling the pixels PXL and the driver.

When the display device is one in which a display surface is applied to at least one surface thereof such as a smart phone, a television, a tablet PC, a mobile phone, an image phone, an electron book reader, a desktop PC, a laptop PC, a netbook computer, a workstation, a server, a PDA, a portable multimedia player (PMP), an MP3 player, a medical device, a camera, and/or a wearable device, the present disclosure may be applied thereto.

The display device may be classified into a passive matrix type or kind of display device and an active matrix type or kind of display device according to a method of driving the light emitting element LD. For example, when the display device is implemented as the active matrix type or kind of display device, each of the pixels PXL may include a driving transistor for controlling an amount of current supplied to the light emitting element LD, a switching transistor that transmits a data signal to the driving transistor, and/or the like.

The display device may be provided in various suitable shapes, and as an example, may be provided in a rectangular plate shape having two pairs of sides parallel (e.g., substantially parallel) to each other, but the present disclosure is not limited thereto.

The substrate SUB may include a display area DA and a non-display area NDA.

The display area DA may be an area in which the pixels PXL for displaying an image are provided. The non-display area NDA may be an area in which the driver for driving the pixels PXL and a portion of the wire part coupling the driver and the pixels PXL are provided. For better understanding and ease of description, only one pixel PXL is shown in FIG. 8, but a plurality of pixels PXL may be substantially provided in the display area DA of the substrate SUB.

The non-display area NDA may be provided in at least one side of the display area DA. The non-display area NDA may surround a periphery (e.g., circumference or edge) of the display area DA. The non-display area NDA may be provided with a wire part coupled to the pixels PXL, and a driver coupled to the wire part and for driving the pixels PXL.

The wire part may electrically couple the driver and the pixels PXL. The wire part provides a signal to each pixel PXL, and it may be signal lines coupled to each pixel PXL, for example, a fan-out line coupled to a scan line, a data line, a light emitting control line, and/or the like. In addition, the wire part is a fan-out line coupled to signal lines coupled to each pixel PXL, for example, coupled to a control line, a sensing line, and/or the like, in order to compensate for changes in electrical characteristics of each pixel PXL in real time.

The substrate SUB may include a transparent insulation material to transmit light. The substrate SUB may be a rigid substrate and/or a flexible substrate.

One area on the substrate SUB is provided as the display area DA in which pixels PXL are included, and the remaining area on the substrate SUB may be provided as the non-display area NDA. For example, the substrate SUB may include the display area DA including pixel areas in which respective pixels PXL are included, and the non-display area NDA included around the display area DA (or adjacent to the display area DA).

Each of the pixels PXL may be provided in the display area DA on the substrate SUB. In the embodiment of the present disclosure, the pixels PXL may be arranged in the display area DA in a stripe or PENTILE® arrangement structure (e.g., an RGBG matrix, RGBG structure, or RGBG matrix structure), but the present disclosure is not limited thereto. PENTILE® is a duly registered trademark of Samsung Display Co., Ltd.

Each pixel PXL may include at least one or more light emitting element LD driven by corresponding scan and data signals. The light emitting element LD has a size as small as a nano-scale to a micro-scale, and may be mutually coupled to adjacent light emitting elements in parallel, but the present disclosure is not limited thereto. The light emitting element LD may form a light source of each pixel PXL.

Each pixel PXL includes at least one light source, for example, the light emitting element LD shown in FIG. 1 driven by a set or predetermined signal (for example, a scan signal and a data signal) and/or a set or predetermined power source (for example, a first driving power source and a second driving power source). However, in one or more embodiments of the present disclosure, the type or kind of the light emitting element LD that may be used as the light source of each pixel PXL is not limited thereto.

The driver may provide a set or predetermined signal and a set or predetermined power source to each pixel PXL through the wire part, thereby controlling driving of the pixel PXL. The driver may include a scan driver, a light emission driver, a data driver, and/or a timing controller.

FIG. 9 is a circuit diagram of an electrical connection relationship between constituent elements in a pixel included in the display device of FIG. 8.

For example, FIG. 9 illustrates an electrical connection relationship between constituent elements included in each pixel PXL applicable to an active display device according to an embodiment. However, the types or kinds of constituent elements included in each of the pixels PXL to which one or more embodiments of the present disclosure may be applied are not limited thereto.

In FIG. 9, not only the constituent elements included in each of the pixels PXL illustrated in FIG. 8 but also the area in which the constituent elements are provided are comprehensively referred to as the pixel PXL.

Referring to FIG. 8 and FIG. 9, each pixel PXL (hereinafter referred to as a 'pixel') may include a light emitting unit EMU that generates luminance light corresponding to a data signal. In addition, the pixel PXL may further selectively include a pixel circuit PXC for driving the light emitting unit EMU.

In some embodiments, the light emitting unit EMU may include a plurality of light emitting elements LD coupled in parallel between a first power line PL1 to which a voltage of a first driving power source VDD is applied and a second power line PL2 to which a voltage of a second driving power source VSS is applied. For example, the light emitting unit EMU may include a first pixel electrode PEL1 (also referred to as a "first alignment electrode") coupled to the first power source VDD via the pixel circuit PXC and the first power line PL1, a second pixel electrode PEL2 (also referred to as a "second alignment electrode") coupled to the second power source VSS through the second power line PL2, and a plurality of light emitting elements LD coupled in parallel in the same (e.g., substantially the same) direction between the first and second pixel electrodes PEL1 and PEL2. In one or more embodiments of the present disclosure, the first pixel electrode PEL1 may be an anode electrode, and the second pixel electrode PEL2 may be a cathode electrode. The light emitting elements LD included in the light emitting unit EMU may be substantially similar to or the same as the light emitting elements LD described above with reference to FIG. 1 and FIG. 2.

Each of the light emitting elements LD included in the light emitting unit EMU may include one end portion coupled to the first driving power source VDD through the first pixel electrode PEL1 and the other end portion coupled to the second driving power source VSS through the second pixel electrode PEL2. The first driving power source VDD and the second driving power source VSS may have different potentials. For example, the first driving power source VDD may be set as a high potential power source, and the second driving power source VSS may be set as a low potential power source. In this case, a potential difference between the first and second driving power sources VDD and VSS may be set to be equal to or higher than a threshold voltage of the light emitting elements LD during a light emitting period of the pixel PXL.

As described above, respective light emitting elements LD coupled in parallel in the same (e.g., substantially the same) direction (for example, a forward direction) between the first pixel electrode PEL1 and the second pixel electrode PEL2 respectively supplied with voltages of different potentials may form respective effective light sources. These effective light sources may be collected to form the light emitting unit EMU of the pixel PXL.

The light emitting elements LD of the light emitting unit EMU may emit light having luminance corresponding to a driving current supplied through the corresponding pixel circuit PXC. For example, during each frame period, the pixel circuit PXC may supply a driving current corresponding to a gray value of corresponding frame data to the light emitting unit EMU. The driving current supplied to the light emitting unit EMU may be divided to flow in each of the light emitting elements LD. Therefore, while each light emitting element LD emits light having a luminance corresponding to the current flowing therein, the light emitting unit EMU may emit light having a luminance corresponding to the driving current.

Embodiments in which respective end portions of the light emitting elements LD are coupled in the same (e.g., substantially the same) direction between the first and second driving power sources VDD and VSS are illustrated, but the present disclosure is not limited thereto. In some embodiments, the light emitting unit EMU may further include at least one ineffective light source, for example, a reverse light emitting element LDr, in addition to the light emitting elements LD forming respective effective light sources. The reverse light emitting element LDr is coupled in parallel between the first and second pixel electrodes PEL1 and PEL2 together with the light emitting elements LD forming the effective light sources, but may be coupled between the first and second pixel electrodes PEL1 and PEL2 in the opposite direction with respect to the light emitting elements LD. The reverse light emitting element LDr maintains an inactive state even when a set or predetermined driving voltage (for example, a driving voltage in the forward direction) is applied between the first and second pixel electrodes PEL1 and PEL2, thus a current does not substantially flow in the reverse light emitting element.

The pixel circuit PXC may be coupled to a scan line Si and a data line Dj of the pixel PXL. For example, when the pixel PXL is in an i-th (i is a natural number) row and a j-th (j is a natural number) column of the display area DA, the pixel circuit PXC of the pixel PXL may be coupled to an i-th scan line Si and a j-th data line Dj of the display area DA. In addition, the pixel circuit PXC may be coupled to an i-th control line CLi and a j-th sensing line SENj of the display area DA.

The pixel circuit PXC described above may include first to third transistors T1 to T3 and a storage capacitor Cst.

A first terminal of the second transistor T2 (switching transistor) may be coupled to the j-th data line Dj, and a second terminal thereof may be coupled to a first node N1. Here, the first terminal and the second terminal of the second transistor T2 are different terminals, and for example, when the first terminal is a drain electrode, the second terminal may be a source electrode. In addition, a gate electrode of the second transistor T2 may be coupled to the i-th scan line Si.

The second transistor T2 is turned on when a scan signal of a voltage capable of turning on the second transistor T2 is supplied from the i-th scan line Si to electrically couple the j-th data line Dj and the first node N1. In this case, a data signal of a corresponding frame is supplied to the j-th data line Dj, and accordingly, the data signal is transmitted to the first node N1. The data signal transmitted to the first node N1 is charged in the storage capacitor Cst.

A first terminal of the first transistor T1 (driving transistor) may be coupled to the first driving power source VDD, and a second terminal thereof may be electrically coupled to the first pixel electrode PEL1 of each of the light emitting elements LD. A gate electrode of the first transistor T1 may be coupled to a first node N1. The first transistor T1 may control an amount of driving current supplied to the light emitting elements LD in response to a voltage of the first node N1.

The third transistor T3 may be coupled between the first transistor T1 and the j-th sensing line SENj. For example, a first terminal of the third transistor T3 may be coupled to the first terminal (for example, source electrode) of the first transistor T1 coupled to the first pixel electrode PEL1, and a second terminal of the third transistor T3 may be coupled to the j-th sensing line SENj. A gate electrode of the third transistor T3 may be coupled to the i-th control line CLi. The third transistor T3 is turned on by a control signal of a gate-on voltage supplied to the i-th control line CLi during a set or predetermined sensing period to electrically couple the j-th sensing line SENj to the first transistor T1.

The sensing period may be a period for extracting characteristic information (for example, a threshold voltage of the first transistor T1) of each of the pixels PXL in the display area DA.

The storage capacitor Cst may be formed or coupled between the gate electrode and the second terminal of the first transistor T1. The storage capacitor Cst may charge a voltage corresponding to the data signal supplied to the first node N1, and may maintain the charged voltage until a data signal of a next frame is supplied.

FIG. 9 illustrates an embodiment in which all of the first to third transistors T1 to T3 are N-type transistors, but the present disclosure is not limited thereto. For example, at least one of the first to third transistors T1 and T3 described above may be changed to a P-type transistor. In addition, although FIG. 9 discloses the embodiment in which the light emitting unit EMU is coupled between the pixel circuit PXC and the second driving power source VSS, the light emitting unit EMU may also be coupled between the first driving power source VDD and the pixel circuit PXC.

The structure of the pixel circuit PXC may be variously changed. For example, the pixel circuit PXC may additionally include other circuit elements such as at least one transistor element such as a transistor element for initializing the first node N1 and/or a transistor element for controlling a light emission time of the light emitting elements LD, or a boosting capacitor for boosting the voltage of the first node N1.

In addition, FIG. 8 illustrates embodiments in which the light emitting elements LD forming each light emitting unit EMU are all coupled in parallel, but the present disclosure is not limited thereto. In some embodiments, the light emitting unit EMU may be configured to include at least one series stage including a plurality of light emitting elements LD coupled in parallel to each other. For example, the light emitting unit EMU may be configured to have a serial/parallel mixed structure.

The structure of the pixel PXL that may be applied to embodiments of the present disclosure is not limited to the embodiment illustrated in FIG. 9, and the corresponding pixel PXL may have various suitable structures. For example, each pixel PXL may be configured inside a passive light emitting display device and/or the like. In this case, the pixel circuit PXC may be omitted, and respective end portions of the light emitting elements LD included in the light emitting unit EMU may be directly coupled to the i-th scan line Si, the j-th data line Dj, the first power line PL1 to which the first driving power source VDD is applied, the second power line PL2 to which the second driving power source VSS is applied, and/or a set or predetermined control line.

FIG. 10 is a schematic top plan view of a pixel included in the display device of FIG. 8.

In FIG. 10, for convenience, the transistors T electrically coupled to the light emitting elements LD and the signal lines coupled to the transistors T are omitted.

In addition, in one or more embodiments of the present disclosure, for better understanding and ease of description, a horizontal direction in a plan view is indicated by the first direction DR1, a vertical direction in a plan view is indicated by the second direction DR2, and a thickness direction of the substrate SUB in a plan view is indicated by the third direction DR3. As described herein, the first to third directions DR1, DR2, and DR3 may mean directions indicated by the first to third directions DR1, DR2, and DR3, respectively, as shown in the drawings.

Referring to FIG. 10, each pixel PXL may be provided in the display area (see 'DA' in FIG. 8) of the substrate SUB. The display area DA may include a pixel area PXA in which each pixel PXL is included. The pixel area PXA may include a light emitting area in which light is emitted and a peripheral area adjacent to the light emitting area (or surrounding a periphery of the light emitting area, e.g., a peripheral area). Here, the peripheral area may include a non-light emitting area from which light is not emitted.

Each pixel PXL may include a plurality of light emitting elements LD.

Each of the light emitting elements LD may include a semiconductor of which one end portion is doped with one of first and second conductive dopants and of which the other end portion is doped with the other dopant. The first conductive dopant may be an N-type dopant, and the second conductive dopant may be a P-type dopant. Each of the light emitting elements LD may be the light emitting element LD described with reference to FIG. 1 and FIG. 2.

At least two to several tens of light emitting elements LD may be aligned and/or provided in the pixel area PXA of each pixel PXL, but the number of the light emitting elements LD is not limited thereto. In some embodiments, the number of the light emitting elements LD aligned and/or provided in the pixel area PXA may be variously changed.

Each of the light emitting elements LD may emit one of color light and/or white light. Each of the light emitting elements LD may be aligned between the first pixel electrode PEL1 and the second pixel electrode PEL2 so that its length direction is parallel (e.g., substantially parallel) to the first direction DR1 when viewed in a plan view. The light emitting elements LD may be injected into the pixel area PXA through the printing apparatus (see '1' in FIG. 6) of the embodiment described above, as the form dispersed in the solvent (see 'SLV' in FIG. 6).

Each pixel PXL may include an electrode part. The electrode part may include a plurality of electrodes.

The electrode part may be electrically coupled to each of the light emitting elements LD to apply an electric signal to the light emitting elements LD to emit light. At least some of the electrodes included in the electrode part may be used as an alignment electrode for forming an electric field to align the light emitting elements LD within the pixel area PXA.

The electrode part may include the first pixel electrode PEL1 and the second pixel electrode PEL2.

The first pixel electrode PEL1 may be provided for each pixel PXL. For example, the first pixel electrode PEL1 provided in each pixel PXL may be separated from the first pixel electrode PEL1 provided in the pixels PXL adjacent to the corresponding pixel PXL. The second pixel electrode PEL2 may be a common electrode commonly provided in the pixels PXL arranged along one direction, but the present disclosure is not limited thereto. In some embodiments, the second pixel electrode PEL2 may also be provided for each pixel PXL.

In each pixel PXL, the first pixel electrode PEL1 may be electrically coupled to the pixel circuit (see 'PXC' in FIG. 9) of the corresponding pixel PXL through a first contact hole CH1, and the second pixel electrode PEL2 may be electrically coupled to the second power line (see 'PL2' in FIG. 9) to which the voltage of the second driving power source (see 'VSS' in FIG. 9) is applied through a second contact hole CH2. The first pixel electrode PEL1 may be the first pixel electrode PEL1 described above with reference to FIG. 9, and the second pixel electrode PEL2 may be the second pixel electrode PEL2 described above with reference to FIG. 9.

The first pixel electrode PEL1 may be branched from a first connection wire CNL1 extending along an extension direction thereof, for example, the first direction DR1 crossing the second direction DR2. The first connection wire CNL1 may be integrally provided with the first electrode PEL1. Accordingly, the first connection wire CNL1 may be regarded as an area of the first pixel electrode PEL1.

After the light emitting elements LD are arranged in the pixel area PXA of each pixel PXL, a portion of the first connection wire CNL1 between adjacent pixels PXL in one direction may be removed to individually (or independently) drive each pixel PXL. Accordingly, the first pixel electrode PEL1 of each pixel PXL may be electrically and/or physically separated from the first pixel electrode PEL1 provided in each of the adjacent pixels PXL. The first connection wire CNL1 may be a common wire commonly provided in the pixels PXL arranged along the first direction DR1 before the light emitting elements LD are aligned in the pixel area PXA, and after the light emitting elements LD are aligned, some of the light emitting elements LD may be removed between the adjacent pixels PXL to be included only in the pixel area PXA of the corresponding pixel PXL.

The second pixel electrode PEL2 may be branched from a second connection wire CNL2 extending along the first direction DR1. The second connection wire CNL2 may be integrally provided with the second electrode PEL2. Accordingly, the second connection wire CNL2 may be regarded as an area of the second pixel electrode PEL2.

In one or more embodiments of the present disclosure, the first pixel electrode PEL1 may be an anode electrode, and the second pixel electrode PEL2 may be a cathode electrode.

A plurality of light emitting elements LD may be included (or aligned) between the first pixel electrode PEL1 and the second pixel electrode PEL2. One end portion of at least some of the light emitting elements LD may be electrically coupled to the first pixel electrode PEL1, and the other end portion thereof may be electrically coupled to the second pixel electrode PEL2.

The light emitting elements LD may be spaced apart from each other in one direction, for example, the second direction DR2, and may be included (or aligned) to be substantially parallel to each other between the first pixel electrode PEL1 and the second pixel electrode PEL2. In some embodiments, some of the light emitting elements LD may be adjacent to each other to form a group, and some other of the light emitting elements LD may be spaced apart from each other at a set or predetermined distance to form a group, and they may have a non-uniform density, and may be aligned and arranged in one direction.

The electrode part may further include a first contact electrode CNE1 and a second contact electrode CNE2.

The first contact electrode CNE1 may be provided on the first pixel electrode PEL1 and on one end portion of each of the light emitting elements LD, and the second contact electrode CNE2 may be provided on the second pixel electrode PEL2 and on the other end portion of each of the light emitting elements LD.

Hereinafter, a stacked structure of each pixel PXL will be mainly described with reference to FIG. 11 and FIG. 12.

FIG. 11 is a schematic cross-sectional view taken along line I-I' of FIG. 10, and FIG. 12 is a schematic cross-sectional view taken along line II-II' of FIG. 10.

In FIG. 11 and FIG. 12, one pixel PXL is simplified by showing each electrode as an electrode of a single film and each insulation layer as an insulation layer of a single film, but the present disclosure is not limited thereto.

In addition, in one or more embodiments of the present disclosure, "connection" between two elements may comprehensively mean both electrical and physical connections.

Referring to FIG. 10 to FIG. 12, each pixel PXL may include a pixel circuit layer PCL including the pixel circuit (see 'PXC' in FIG. 9) on the substrate SUB, and a display element layer DPL including a plurality of light emitting elements LD.

For convenience, the pixel circuit layer PCL is first described, and then the display element layer DPL is described.

The substrate SUB may include a transparent insulation material to transmit light. The substrate SUB may be a rigid substrate or a flexible substrate.

For example, the rigid substrate may be one selected from a glass substrate, a quartz substrate, a glass ceramic substrate, and a crystalline glass substrate.

The flexible substrate may be one of a film substrate and/or a plastic substrate, which include a polymer organic material. For example, the flexible substrate may include at least one selected from polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate.

A material applied to the substrate SUB may have resistance (or heat resistance) to a high processing temperature in a manufacturing process of the display device.

The pixel circuit layer PCL may include a buffer layer BFL, the pixel circuit PXC, and a passivation layer PSV.

The buffer layer BFL is provided and/or formed on the substrate SUB, and may prevent or reduce spread of impurities into the transistors T included in the pixel circuit PXC. The buffer layer BFL may be an inorganic insulation film including an inorganic material. The buffer layer BFL may include at least one of metal oxides such as a silicon nitride ($SiN_x$), a silicon oxide ($SiO_x$), a silicon oxynitride ($SiO_xN_y$), and/or an aluminum oxide ($AlO_x$). The buffer layer BFL may be provided as a single film, but may be provided as a multifilm of at least two or more films. When the buffer layer BFL is provided as the multi-film, respective layers thereof may be made of the same material or different materials. The buffer layer BFL may be omitted depending on the material, a process condition, and/or the like of the substrate SUB.

The pixel circuit PXC may include at least one transistor T and a storage capacitor Cst. The transistor T may include a driving transistor Tdr for controlling a driving current of the light emitting elements LD and a switching transistor Tsw coupled to the driving transistor Tdr. However, the present disclosure is not limited thereto, and the pixel circuit PXC may further include circuit elements that perform other functions in addition to the driving transistor Tdr and the switching transistor Tsw. In the following embodiment, the driving transistor Tdr and the switching transistor Tsw are comprehensively referred to as a transistor T or transistors T. The driving transistor Tdr may have the same configuration as the first transistor T1 described with reference to FIG. 9, and the switching transistor Tsw may have the same configuration as the second transistor T2 described with reference to FIG. 9.

Each of the driving transistor Tdr and the switching transistor Tsw may include a semiconductor pattern SCL, a gate electrode GE, a first terminal SE, and a second terminal DE. The first terminal SE may be one selected from a source electrode and a drain electrode, and the second terminal DE may be the remaining electrode. For example, when the first terminal SE is the source electrode, the second terminal DE may be the drain electrode.

The semiconductor pattern SCL may be provided and/or formed on the buffer layer BFL. The semiconductor pattern SCL may include a first contact area in contact (e.g., physical contact) with the first terminal SE and a second contact area in contact (e.g., physical contact) with the second terminal DE. An area between the first contact area and the second contact area may be a channel area. The channel area may overlap the gate electrode GE of the corresponding transistor T. The semiconductor pattern SCL may be a semiconductor pattern made of a poly silicon, an amorphous silicon, an oxide semiconductor, and/or the like. For example, the channel area, which is a semiconductor pattern that is not doped with impurities, may be an intrinsic semiconductor. The first contact area and the second contact area may be semiconductor patterns doped with impurities.

The gate electrode GE may be provided and/or formed on a gate insulation layer GI to correspond to the channel area of the semiconductor pattern SCL. The gate electrode GE may be provided on the gate insulation layer GI to overlap the channel area of the semiconductor pattern SCL. The gate electrode GE may be formed to have a single film structure of a single or a mixture thereof selected from the group consisting of copper (Cu), molybdenum (Mo), tungsten (W), aluminum neodymium (AlNd), titanium (Ti), aluminum (Al), silver (Ag), and an alloy thereof, or in order to reduce wire resistance, it may be formed to have a two layer film structure or a multi-layer film structure of molybdenum (Mo), titanium (Ti), copper (Cu), aluminum (Al), and/or silver (Ag), which are each a low-resistance material.

The gate insulation layer GI may be an inorganic insulation film including an inorganic material. For example, the gate insulation layer GI may include at least one of metal oxides such as a silicon nitride ($SiN_x$), a silicon oxide ($SiO_x$), a silicon oxynitride ($SiO_xN_y$), and/or an aluminum oxide ($AlO_x$). However, the material of the gate insulation layer GI is not limited to the above-described embodiment, and various suitable materials that provide an insulation property (e.g., an electrically insulating property) to the gate insulation layer GI may be applied according to embodiments. For example, the gate insulation layer GI may be formed as an organic insulation film including an organic material. The gate insulation layer GI may be provided as a single film, and may be provided as a multi-film of at least two or more films.

Each of the first terminal SE and the second terminal DE may be provided and/or formed on a second interlayer insulation layer ILD2, and may contact (e.g., physically contact) the first contact area and the second contact area of the semiconductor pattern SCL through a contact hole sequentially passing through the gate insulation layer GI and the first and second interlayer insulation layers ILD1 and ILD2. For example, the first terminal SE may contact (e.g., physically contact) the first contact area of the semiconductor pattern SCL, and the second terminal DE may contact (e.g., physically contact) the second contact area of the semiconductor pattern SCL. Each of the first and second terminals SE and DE may include the same material as that of the gate electrode GE, or may include one or more materials selected from the materials illustrated as constituent materials of the gate electrode GE.

The first interlayer insulation layer ILD1 may include the same material as that of the gate insulation layer GI, or may include one or more materials selected from the materials illustrated as constituent materials of the gate insulation layer GI.

The second interlayer insulation layer ILD2 may be provided and/or formed on the first interlayer insulation layer ILD1. The second interlayer insulation layer INS2 may be an inorganic insulation film including an inorganic material and/or an organic insulation film including an organic material. In some embodiments, the second interlayer insulation layer ILD2 may include the same material as the first interlayer insulation layer ILD1, but the present disclosure is not limited thereto. The second interlayer insulation layer ILD2 may be provided as a single film, and may be provided as a multi-layer film of at least two or more films.

In the above-described embodiment, it is described that the first and second terminals SE and DE of each of the driving transistor Tdr and the switching transistor Tsw are separate electrodes that are electrically coupled to the semiconductor pattern SCL through the contact hole sequentially penetrating the gate insulation layer GI and the first and second interlayer insulation layer ILD1 and ILD2, but the present disclosure is not limited thereto. In some embodiments, the first terminal SE of each of the driving transistor Tdr and the switching transistor Tsw may be a first contact area adjacent to the channel area of the corresponding semiconductor pattern SCL, and the second terminal DE of each of the driving transistor Tdr and the switching transistor Tsw may be a second contact area adjacent to the channel area of the corresponding semiconductor pattern SCL. In this case, the second terminal DE of the driving transistor Tdr may be electrically coupled to the light emitting elements LD of the corresponding pixel PXL through a separate connection member such as a bridge electrode.

In one or more embodiments of the present disclosure, the transistors T may be configured as a low temperature polysilicon thin film transistor (LTPS TFT), but the present disclosure is not limited thereto. In some embodiments, the transistors T may be configured as an oxide semiconductor thin film transistor. In addition, in the above-described embodiment, the case in which the transistors T are thin film transistors having a top gate structure is described as an example, but the present disclosure is not limited thereto, and the structure of the transistors T may be variously changed.

The storage capacitor Cst may include a lower electrode LE provided on the gate insulation layer GI and an upper electrode UE provided on the first interlayer insulation layer ILD1 and overlapping the lower electrode LE.

The lower electrode LE may be provided on the same layer as the gate electrode GE of each of the driving transistor Tdr and the switching transistor Tsw, and may include the same material. The lower electrode LE may be integrally provided with the gate electrode GE of the driving transistor Tdr. In this case, the lower electrode LE may be regarded as an area of the gate electrode GE of the driving transistor Tdr. In some embodiments, the lower electrode LE may be provided in a separate configuration (or non-integral configuration) from the gate electrode GE of the driving transistor Tdr. In this case, the lower electrode LE and the gate electrode GE of the driving transistor Tdr may be electrically coupled through a separate connection element.

The upper electrode UE may overlap the lower electrode LE, and may cover the lower electrode LE. Capacitance of the storage capacitor Cst may be increased by increasing an overlapping area of the upper electrode UE and the lower electrode LE. The upper electrode UE may be electrically coupled to the first power line PL1.

The storage capacitor Cst may be covered by the second interlayer insulation layer ILD2.

The pixel circuit layer PCL may include a driving voltage wire DVL provided and/or formed on the second interlayer insulation layer ILD2. The driving voltage wire DVL may have the same configuration as the second power line PL2 described with reference to FIG. 9. The driving voltage wire DVL may be coupled to the second driving power source VSS. Therefore, the voltage of the second driving power source VSS may be applied to the driving voltage wire DVL. The pixel circuit layer PCL may further include the first power line PL1 coupled to the first driving power source VDD. In one or more embodiments, the first power line PL1 may be provided on the same layer as the driving voltage wire DVL, or may be provided on a different layer from the driving voltage wire DVL.

Each of the first power line PL1 and the driving voltage wire DVL may include a conductive material (e.g., an electrically conductive material). For example, each of the first power line PL1 and the driving voltage wire DVL may be formed to have a single film structure of a single or a mixture thereof selected from the group consisting of copper (Cu), molybdenum (Mo), tungsten (W), aluminum neodymium (AlNd), titanium (Ti), aluminum (Al), silver (Ag), and an alloy thereof, or in order to reduce wire resistance, it may be formed to have a two layer film structure or a multi-layer film structure of molybdenum (Mo), titanium (Ti), copper (Cu), aluminum (Al), and/or silver (Ag), each of which is a low-resistance material. For example, each of the first power line PL1 and the driving voltage wire DVL may be configured of a two layer film stacked in the order of titanium (Ti)/copper (Cu).

The passivation layer PSV may be provided and/or formed on the transistors T and the driving voltage wire DVL.

The passivation layer PSV may be include an organic insulation film, an inorganic insulation film, or the organic insulation film on the inorganic insulation film. The inorganic insulation film may include, for example, at least one of metal oxides such as a silicon nitride ($SiN_x$), a silicon oxide ($SiO_x$), a silicon oxynitride ($SiO_xN_y$), and/or an aluminum oxide ($AlO_x$). The organic insulation film may be, for example, at least one selected from a polyacrylate resin, an epoxy resin, a phenolic resin, a polyamide resin, a polyimide resin, an unsaturated polyester resin, a poly-phenylene ether resin, a poly-phenylene sulfide resin, and a benzocyclobutene resin.

The passivation layer PSV may include the first contact hole CH1 exposing one area of the driving transistor Tdr and the second contact hole CH2 exposing one area of the driving voltage wire DVL.

The display element layer DPL may be provided on the passivation layer PSV.

The display element layer DPL includes first and second banks BNK1 and BNK2, the first and second connection wires CNL1 and CNL2, the first and second pixel electrodes PEL1 and PEL2, the light emitting elements LD, and the first and second contact electrodes CNE1 and CNE2. In addition, the display element layer DPL may include first to third insulation layers INS1 to INS3.

The first bank BNK1 may be in a light emitting area in which light is emitted in the pixel area PXA of each of the pixels PXL. The first bank BNK1 may be a support member supporting each of the first and second pixel electrodes PEL1 and PEL2 so as to change the surface profile (or shape) in the third direction DR3 of each of the first and second pixel electrodes PEL1 and PEL2 for guiding the light emitted from the light emitting elements LD in the image display direction (for example, the front direction) of the display device. For example, the first bank BNK1 may change the surface profile (or shape) of each of the first and second pixel electrodes PEL1 and PEL2 in the third direction DR3.

The first bank BNK1 may be provided and/or formed between the passivation layer PSV and the corresponding electrode in the light emitting area of the corresponding pixel PXL. For example, the first bank BNK1 may be provided and/or formed between the passivation layer PSV and the first pixel electrode PEL1 and between the passivation layer PSV and the second pixel electrode PEL2, respectively.

The first bank BNK1 may be an inorganic insulation film including an inorganic material and/or an organic insulation film including an organic material. In some embodiments, the first bank BNK1 may include an organic insulation film of a single film and/or an inorganic insulation film of a single layer, but the present disclosure is not limited thereto. In some embodiments, the first bank BNK1 may be provided in a multi-layered structure in which at least one or more of an organic insulation film and at least one or more of inorganic insulation film are stacked. However, the material of the first bank BNK1 is not limited to the above-described embodiments, and in some embodiments, the first bank BNK1 may include a conductive material (e.g., an electrically conductive material).

The first bank BNK1 may have cross-sections of a trapezoidal shape of which width is narrowed from one surface (for example, an upper surface) of the passivation layer PSV toward an upper portion thereof along the third direction DR3, but the present disclosure is not limited thereto. In some embodiments, the first bank BNK1 may include a curved surface having a cross section of a semi-elliptic shape (e.g., a semi-elliptical shape) or a semi-circular shape (or a semi-spherical shape) of which width is narrowed from one surface of the passivation layer PSV toward an upper portion thereof along the third direction DR3. When viewed in a cross-sectional view, the shape of the first bank BNK1 is not limited to the above-described embodiments, and the shape thereof may be variously changed within a range in which the first bank may improve efficiency of light emitted from each of the light emitting elements LD. When viewed in a cross-sectional view, the shape of the first bank BNK1 is not limited to the above-described embodiments, and the shape thereof may be variously changed within a range in which the first bank may improve efficiency of light emitted from each of the light emitting elements LD. The first banks BNK1 adjacent in the first direction DR1 may be on the same surface as the passivation layer PSV, and may have the same height (or thickness) in the third direction DR3.

In the above-described embodiment, it has been described that the first bank BNK1 is provided and/or formed on the passivation layer PSV such that the first bank BNK1 and the passivation layer PSV are formed by different processes, but the present disclosure is not limited thereto. In some embodiments, the first bank BNK1 and the passivation layer PSV may be formed through the same process. In this case, the first bank BNK1 may be one area of the passivation layer PSV.

The second bank BNK2 may be a structure that defines (or partitions) the pixel areas PXA (or light emitting areas) of each pixel PXL and of each of pixels adjacent thereto, and for example, may be a pixel defining film. The second bank BNK2 may include at least one light blocking material and/or a reflective material to prevent or reduce light leakage from occurring between each pixel PXL and pixels PXL adjacent thereto. In some embodiments, the second bank BNK2 may include a transparent material (and/or substance). As the transparent material, for example, a polyamide resin, a polyimide resin, and/or the like may be included, but the present disclosure is not limited thereto. According to another embodiment, a reflective material layer may be formed on the second bank BNK2 to further improve the efficiency of light emitted from each pixel PXL.

The second bank BNK2 may be provided and/or formed on a layer different from the first bank BNK1, but the present disclosure is not limited thereto, and in some embodiments, the second bank BNK2 may be provided and/or formed on the same layer as the first bank BNK1. In one or more embodiments of the present disclosure, the second bank BNK2 may be formed on a different layer from the first bank BNK1, and may be provided and/or formed on the first insulation layer INS1.

The first and second pixel electrodes PEL1 and PEL2 may be provided and/or formed on the corresponding first bank BNK1.

Each of the first and second electrodes PEL1 and PEL2 may be made of a material having a constant reflectance (e.g., a substantially constant reflectance or a substantially uniform reflectance) in order to allow light emitted from each of the light emitting elements LD to progress in an image display direction of the display device. Each of the first and second pixel electrodes PEL1 and PEL2 may be made of a conductive material (e.g., an electrically conductive material) having a constant reflectance (e.g., a substantially constant reflectance or a substantially uniform reflectance). The conductive material may include an opaque metal that is advantageous or beneficial for reflecting light emitted by the light emitting elements LD in the image display direction of the display device. The opaque metal may include, for example, silver (Ag), magnesium (Mg), aluminum (Al), platinum (Pt), palladium (Pd), gold (Au), nickel (Ni), neodymium (Nd), iridium (Ir), chromium (Cr), titanium (Ti), and/or an alloy thereof. In some embodiments, each of the first and second pixel electrodes PEL1 and PEL2 may include a transparent conductive material. The transparent conductive material may include a conductive oxide such as an indium tin oxide (ITO), an indium zinc oxide (IZO), a zinc oxide (ZnO), an indium gallium zinc oxide (IGZO), and/or an indium tin zinc oxide (ITZO), and/or a conductive polymer such as poly(3,4-ethylenedioxythiophene (PEDOT). When each of the first and second pixel electrodes PEL1 and PEL2 includes the transparent conductive material, a separate conductive layer, which is made of an opaque metal that reflects light emitted from the light emitting elements LD in the image display direction of the display device, may be added. However, the material of each of the first and second pixel electrodes PEL1 and PEL2 is not limited to the materials described above.

Each of the first and second pixel electrodes PEL1 and PEL2 may be provided and/or formed as a single film, but the present disclosure is not limited thereto. In some embodiments, each of the first and second pixel electrodes PEL1 and PEL2 may be provided and/or formed as a multi-layered film in which at least two or more selected from metals, alloys, conductive oxides, and conductive polymers are stacked. Each of the first and second pixel electrodes PEL1 and PEL2 may be formed of a multi-layered film of at least a two or more layers to minimize or reduce distortion caused by signal delay when transmitting a signal (or voltage) to respective end portions of each of the light emitting elements LD. For example, each of the first and second pixel electrodes PEL1 and PEL2 may be formed of a multi-layered film sequentially stacked in an order of indium tin oxide (ITO)/silver (Ag)/indium tin oxide (ITO).

As described above, the first pixel electrode PEL1 may be electrically coupled to the driving transistor Tdr through the first contact hole CH1, and the second pixel electrode PEL2 may be electrically coupled to the driving voltage wire DVL through the second contact hole CH2.

Each of the first pixel electrode PEL1 and the second pixel electrode PEL2 may be used as an alignment electrode (or alignment wire) that receives a set or predetermined alignment signal (or alignment voltage) from some corresponding constituent elements of the pixel circuit layer PCL to align the light emitting elements LD. For example, the first pixel electrode PEL1 may be used as a first alignment electrode (or first alignment wire) by receiving a first alignment signal (or first alignment voltage) from some constituent elements of the pixel circuit layer PCL, and the second pixel electrode PEL2 may be used as a second alignment electrode (or second alignment wire) by receiving a second alignment signal (or second alignment voltage) from some other constituent elements of the pixel circuit layer PCL.

After the light emitting elements LD are aligned in the pixel area PXA of each pixel PXL, a portion of the first pixel electrode PEL1 (for example, a portion of the first connection wire CNL1) between pixels PXL adjacent in one direction, for example, the first direction DR1 and/or the second direction DR2 may be removed, in order to individually (or independently) drive the corresponding pixel PXL.

After the light emitting elements LD are aligned in the pixel area PXA, the first pixel electrode EL1 and the second pixel electrode EL2 may be used as driving electrodes for driving the light emitting elements LD.

Each of the light emitting elements LD may be an ultra-small light emitting diode using a material having an inorganic crystal structure, for example, having a size as small as a nano-scale or a micro-scale. Each of the light emitting elements LD may be a ultra-small light emitting diode manufactured by an etching method and/or a ultra-small light emitting diode manufactured by a growth method. Each of the light emitting elements LD may be the light emitting element LD described with reference to FIG. 1 and FIG. 2.

The first insulation layer INS1 may be provided and/or formed on the first and second pixel electrodes PEL1 and PEL2.

The first insulation layer INS1 may include an inorganic insulation film made of an inorganic material and/or an organic insulation film made of an organic material. The first insulation layer INS1 may be formed as an inorganic insulation film that is advantageous or beneficial for protecting the light emitting elements LD from the pixel circuit layer PCL of each pixel PXL. For example, the first insulation layer INS1 may include at least one of metal oxides such as a silicon nitride ($SiN_x$), a silicon oxide ($SiO_x$), a silicon oxynitride ($SiO_xN_y$), and/or an aluminum oxide ($AlO_x$), but the present disclosure is not limited thereto. In some embodiments, the first insulation layer INS1 may be formed as an organic insulation film that is advantageous or beneficial for flattening a support surface of the light emitting elements LD.

The first insulation layer INS1 may include a first opening OPN1 exposing one area of the first pixel electrode PEL1 and a second opening OPN2 exposing one area of the second pixel electrode PEL2. The light emitting elements LD may be included (or aligned) on the first insulation layer INS1 between the first pixel electrode PEL1 and the second pixel electrode PEL2.

The first pixel electrode PEL1 may directly contact (e.g., physically contact) the first contact electrode CNE1 by the first opening OPN1 to be coupled to the first contact electrode CNE1, and the second pixel electrode PEL2 may directly contact (e.g., physically contact) the second contact electrode CNE2 through the second opening OPN2 of the first insulation layer INS1 to be coupled to the second contact electrode CNE2. The first insulation layer INS1 may cover the remaining areas excluding one area of each of the first and second pixel electrodes PEL1 and PEL2.

The second insulation layer INS2 may be provided and/or formed on each of the light emitting elements LD. The second insulation layer INS2 may be provided and/or formed on the light emitting elements LD to partially cover an outer peripheral surface (e.g., an outer circumferential surface or a surface) of each of the light emitting elements LD to expose respective end portions of each of the light emitting elements LD to the outside. The second insulation layer INS2 may be formed as an independent insulation pattern in the pixel area PXA of each pixel PXL, but the present disclosure is not limited thereto.

The second insulation layer INS2 may be formed as a single film or a multi-layer film, and may include an inorganic insulation film including at least one inorganic material and/or an organic insulation film including at least one organic material. The second insulation layer INS2 may include an inorganic insulation film that is advantageous or beneficial for protecting the active layer 12 of each of the light emitting elements LD from external oxygen and/or moisture. However, the present disclosure is not limited thereto. Depending on design conditions of the display device to which the light emitting elements LD are applied, the second insulation layer INS2 may be formed as an organic insulation film including an organic material. After the alignment of the light emitting elements LD is completed in the pixel area PXA of each of the pixels PXL, by forming the second insulation layer INS2 on the light emitting elements LD, it is possible to prevent or reduce deviation of the light emitting elements LD from the aligned position.

The second insulation layer INS2 is formed on the light emitting elements LD, so that the active layer of each of the light emitting elements LD (see '12' of FIG. 1) may not be in contact (e.g., physical contact) with an external conductive material. The second insulation layer INS2 may cover only a portion of an outer peripheral surface (e.g., an outer circumferential surface or a surface) of each of the light emitting elements LD, thereby exposing respective end portions of each of the light emitting elements LD to the outside.

The first contact electrode CNE1 may be provided on the first pixel electrode PEL1 to be coupled to the first pixel electrode PEL1 by the first opening OPN1 of the first insulation layer INS1. In some embodiments, when a capping layer is on the first pixel electrode PEL1, the first contact electrode CNE1 may be on the capping layer to be coupled to the first pixel electrode PEL1 through the capping layer. The above-described capping layer may protect the first pixel electrode PEL1 from defects occurring during a manufacturing process of a display device, and may further increase adherence between the first pixel electrode PEL1 and the pixel circuit layer PCL under the first pixel electrode PEL1. The capping layer may include a transparent conductive material (or substance) such as an indium zinc oxide (IZO).

In addition, the first contact electrode CNE1 may be provided and/or formed on one end portion of each of the light emitting elements LD to be coupled to one end portion of each of the light emitting elements LD. Accordingly, the first pixel electrode PEL1 and one end portion of each of the light emitting elements LD may be electrically coupled to each other through the first contact electrode CNE1.

The second contact electrode CNE2 may be provided on the second pixel electrode PEL2 to be coupled to the second pixel electrode PEL2 by the second opening OPN2 of the first insulation layer INS1. In some embodiments, when a capping layer is on the second pixel electrode PEL2, the second contact electrode CNE2 may be on the capping layer to be coupled to the second pixel electrode PEL2 through the capping layer.

In addition, the second contact electrode CNE2 may be provided and/or formed on the other end portion of each of the light emitting elements LD to be coupled to the other end portion of each of the light emitting elements LD. Accordingly, the second pixel electrode PEL2 and the other end portion of each of the light emitting elements LD may be electrically coupled to each other through the second contact electrode CNE2.

The first and second contact electrodes CNE1 and CNE2 may be made of various suitable transparent conductive materials so that the light that is emitted from each of the light emitting elements LD and reflected by the first and second electrodes PEL1 and PEL2 proceeds in the image display direction of the display device without (or substantially without) loss. For example, the first and second contact electrodes CNE1 and CNE2 may include at least one of various suitable transparent conductive materials (or substances) such as an indium tin oxide (ITO), an indium zinc oxide (IZO), a zinc oxide (ZnO), an indium gallium zinc oxide (IGZO), and/or an indium tin zinc oxide (ITZO), and may be formed to be substantially transparent or translucent to satisfy a set or predetermined light transmittance (or transmittance). However, the materials of the first and second contact electrodes CNE1 and CNE2 are not limited to the above-described embodiment. In some embodiments, the first and second contact electrodes CNE1 and CNE2 may be made of various suitable opaque conductive materials (and/or substances). The first and second contact electrodes CNE1 and CNE2 may be formed as a single film or a multi-layer film.

When viewed in a plan view each of the first and second contact electrodes CNE1 and CNE2 may have a bar shape extending along the second direction DR2, but the present disclosure is not limited thereto. In some embodiments, the shapes of the first and second contact electrodes CNE1 and CNE2 may be variously changed within a range in which they are electrically stably coupled to each of the light emitting elements LD. In addition, the shapes of the first and second contact electrodes CNE1 and CNE2 may be variously changed in consideration of the connection relationship with electrodes thereunder.

The first and second contact electrodes CNE1 and CNE2 may be spaced apart from each other in the first direction DR1. For example, the first contact electrode CNE1 and the second contact electrode CNE2 may be spaced apart from each other with a set or predetermined interval on the second insulation layer INS2 on the first light emitting elements LD. The first contact electrode CNE1 and the second contact electrode CNE2 may be provided on the same layer and may be formed through the same process. However, the present disclosure is not limited thereto, and in some embodiments, the first each second contact electrodes CNE1 and CNE2 may be provided in different layers, and may be formed through different processes.

The third insulation layer INS3 may be provided and/or formed on the first and second contact electrodes CNE1 and CNE2. The third insulation layer INS3 may be an inorganic insulation film including an inorganic material or an organic insulation film including an organic material. For example, the third insulation layer INS3 may have a structure in which at least one inorganic insulation film and at least one organic insulation film are alternately stacked. The third insulation layer INS3 may entirely cover the display element layer DPL to block or reduce the introduction of air and/or moisture from the outside into the display element layer DPL including the light emitting elements LD.

In some embodiments, the display element layer DPL may be configured to selectively further include an optical layer in addition to the third insulation layer INS3. Here, the optical layer may include a color conversion layer including color conversion particles that convert light emitted from light emitting elements LD into light of a set or specific color.

Hereinafter, a method of fabricating the display device described above will be described.

FIG. 13 to FIG. 15 are schematic cross-sectional views illustrating process steps of a method of fabricating a display device according to an embodiment.

For better understanding and ease of description, in FIG. 13 to FIG. 15, elements under the passivation layer PSV are not illustrated.

Referring to FIG. 13, a substrate that includes the passivation layer PSV, the first bank BNK provided on the passivation layer PSV, the first and second pixel electrodes PEL1 and PEL2 provided on the corresponding first bank BNK and spaced apart from each other in the first direction DR1, and an insulation material layer INSM covering them, is prepared. The substrate may be the target substrate SUB described with reference to FIG. 7. The above-described elements provided on the substrate may be formed by patterning a conductive layer (or metal layer), an inorganic material and/or an organic material, and/or the like by performing a process using a mask.

Next, referring to FIG. 14, the material INK (or ink) including the light emitting elements LD is sprayed onto the substrate SUB by using a printing apparatus. The printing apparatus may be the printing apparatus 1 described with reference to FIG. 6 and FIG. 7.

The material INK may be a mixture including the fluid solvent SLV and the plurality of light emitting elements LD included (or dispersed) in the solvent SLV.

Referring to FIG. 15, an electric field is formed between the first pixel electrode PEL1 and the second pixel electrode PEL2 by applying an alignment signal corresponding to each of the first and second pixel electrodes PEL1 and PEL2. Due to the electric field, the material INK may be stably aligned in a desired area (for example, an area between the first pixel electrode PEL1 and the second pixel electrode PEL2). The solvent SLV contained in the material INK is volatilized or removed in another manner after the light emitting elements LD are aligned, so that the light emitting elements LD may be finally aligned on the insulation material layer INSM.

Subsequently, by performing an additional process, the first and second insulation layers INS1 and INS2, the first and second contact electrodes CNE1 and CNE2, and the third insulation layer INS3 described with reference to FIG. 11 and FIG. 12 may be formed to manufacture the display device according to an embodiment. For example, in order to electrically couple the first contact electrode CNE1 and the first pixel electrode PEL1, and the second contact electrode CNE2 and the second pixel electrode PEL2, the insulation material layer INSM may be partially removed to form the first insulation layer INS1.

According to the display device manufactured as described above, as the material INK (or ink) including the light emitting elements LD is stably ejected from the printing apparatus 1, the light emitting elements LD may be aligned in a desired area at a high alignment degree. As the alignment degree of the light emitting elements LD is improved, connection or contact failure between the light emitting elements LD and components included in the electrode part, for example, the first and second pixel electrodes PEL1 and PEL2 and the first and second contact electrodes CNE1 and CNE2 may be reduced. Accordingly, the reliability of the display device may be improved.

While the subject matter of the present disclosure has been shown and described with reference to certain embodiments thereof, it will be understood by those skilled in the art that various changes in forms and details may be made therein without departing from the spirit and scope of the present disclosure as defined by the appended claims, and equivalents thereof.

Therefore, the technical scope of the present disclosure may be determined by the technical scope of the accompanying claims, and equivalents thereof.

What is claimed is:

1. A reservoir of light emitting elements, the reservoir comprising:
   a storage container accommodating a material in which at least one light emitting element is dispersed;
   a first electrode and a second electrode spaced apart from each other in the storage container; and
   a power supply electrically coupled to each of the first electrode and the second electrode to apply a power source corresponding to each of the first electrode and the second electrode,
   wherein holes are formed in each of the first electrode and the second electrode.

2. The reservoir of the light emitting elements of claim 1, wherein each of the holes has a diameter in a range from 1 μm to 20 μm.

3. The reservoir of the light emitting elements of claim 2, wherein the light emitting element comprises a nano-scale to micro-scale light emitting diode, and
   a diameter of each of the holes is larger than a length of the light emitting element.

4. The reservoir of the light emitting elements of claim 1, wherein each of the first electrode and second electrode has a plate shape, and the first electrode and the second electrode are alternately included along a first direction perpendicular to surfaces of the first electrode and the second electrode.

5. The reservoir of the light emitting elements of claim 4, wherein a gap between adjacent electrodes of the first electrode and the second electrode is within a range of 10 μm to 1000 μm.

6. The reservoir of the light emitting elements of claim 4, wherein the first direction is perpendicular to a direction of gravity.

7. The reservoir of the light emitting elements of claim 4, wherein the first direction is a same as a direction of gravity.

8. The reservoir of the light emitting elements of claim 1, wherein each of the first electrode and the second electrode has a plate shape, and the first electrode and the second electrode are spaced apart from each other along a direction parallel to surfaces of the first electrode and the second electrode.

9. The reservoir of the light emitting elements of claim 8, wherein the material further comprises a fluid solvent,
the at least one light emitting element is dispersed in the solvent,
the solvent flows upwardly at a center of an area of each of the first electrode and the second electrode and flows downwardly between the first electrode and the second electrode, by electroosmosis, and
the material is stirred in the storage container by the flowing of the solvent.

10. The reservoir of the light emitting elements of claim 1, wherein voltages of different power sources are respectively applied to the first electrode and the second electrode.

11. The reservoir of the light emitting elements of claim 1, wherein each of the light emitting elements comprises:
a first semiconductor layer doped with a first conductive dopant;
a second semiconductor layer doped with a second conductive dopant different from the first conductive dopant; and
an active layer between the first semiconductor layer and the second semiconductor layer.

12. A printing apparatus comprising:
a storage unit accommodating a material in which at least one light emitting element is dispersed; and
a print head unit that sprays the material supplied from the storage unit,
wherein the storage unit comprises:
a storage container accommodating the material in which the at least one light emitting element is dispersed;
a first electrode and a second electrode spaced apart from each other in the storage container; and
a power supply electrically coupled to each of the first electrode and the second electrode to apply a power source corresponding to each of the first electrode and the second electrode, and holes are formed in each of the first electrode and the second electrode.

13. The printing apparatus of claim 12, wherein: each of the holes has a diameter in a range from 1 μm to 20 μm.

14. The printing apparatus of claim 13, wherein the light emitting element comprises a nano-scale to micro-scale light emitting diode, and
a diameter of each of the holes is larger than a length of the light emitting element.

15. The printing apparatus of claim 12, wherein each of the first electrode and the second electrode has a plate shape, and the first electrode and the second electrode are alternately included along a first direction perpendicular to surfaces of the first electrode and the second electrode.

16. The printing apparatus of claim 15, wherein a gap between adjacent electrodes of the first electrode and the second electrode is within a range of 10 μm to 1000 μm.

17. A method of fabricating a display device that uses a printing apparatus comprising a storage unit accommodating a material in which at least one light emitting element is dispersed, and a print head unit that sprays a material supplied from the storage unit, the method comprising:
preparing a substrate comprising a first pixel electrode and a second pixel electrode spaced apart from each other;
spraying the material onto the substrate through the print head unit; and
aligning the at least one light emitting element of the material between the first pixel electrode and the second pixel electrode,
wherein the material is a fluid solvent and an ink in which the at least one light emitting element is dispersed in the solvent, and further comprising:
applying a power source to a first electrode and a second electrode spaced apart from each other in the storage container of the storage unit, wherein an electric field is formed between the first electrode and the second electrode, so that the material is stirred by electroosmosis, and the light emitting element is maintained in a floating state in the storage container.

18. The method of fabricating the display device of claim 17, wherein holes are formed in each of the first electrode and the second electrode, and
microbubbles generated inside the storage container in a process of stirring the material are removed while passing through the holes.

* * * * *